(12) United States Patent
Yonehara

(10) Patent No.: US 8,053,335 B2
(45) Date of Patent: Nov. 8, 2011

(54) FORMING METHOD OF GALLIUM NITRIDE SYSTEM COMPOUND SEMICONDUCTOR LAYER, TRANSFER METHOD OF THE SAME, AND SUBSTRATE STRUCTURE WITH THE SAME BONDED THERETO

(76) Inventor: Takao Yonehara, Kawasaki (JP)

( * ) Notice: Subject to any disclaimer, the term of this patent is extended or adjusted under 35 U.S.C. 154(b) by 36 days.

(21) Appl. No.: 12/611,791

(22) Filed: Nov. 3, 2009

(65) Prior Publication Data

US 2010/0109019 A1    May 6, 2010

(30) Foreign Application Priority Data

Nov. 4, 2008   (JP) .................................. 2008-282794

(51) Int. Cl.
*H01L 21/52* (2006.01)
*H01L 21/50* (2006.01)

(52) U.S. Cl. ........ 438/459; 438/421; 438/455; 438/458; 438/460; 438/462; 438/481; 438/690; 257/84; 257/88; 257/288; 257/565; 257/E21.211; 257/E21.409; 257/E21.482; 257/E33.001

(58) Field of Classification Search ............ 438/421, 438/455, 458, 459, 460, 462, 481, 690; 257/84, 257/88, 288, 565, E21.211, E21.409, E21.482, 257/E33.001
See application file for complete search history.

(56) References Cited

U.S. PATENT DOCUMENTS

| | | | |
|---|---|---|---|
| 5,334,277 A | 8/1994 | Nakamura | |
| 5,433,169 A | 7/1995 | Nakamura | |
| 6,420,242 B1 | 7/2002 | Cheung et al. | |
| 7,084,563 B2 * | 8/2006 | Chowdhury et al. | 313/498 |
| 2005/0042787 A1 * | 2/2005 | Ito et al. | 438/41 |
| 2006/0246636 A1 * | 11/2006 | Imai et al. | 438/149 |
| 2007/0085093 A1 * | 4/2007 | Ohmae et al. | 257/89 |
| 2010/0059748 A1 * | 3/2010 | Yamazaki et al. | 257/49 |

FOREIGN PATENT DOCUMENTS

| JP | 2628404 B2 | 7/1997 |
|---|---|---|
| JP | 2006-222402 A | 8/2006 |

* cited by examiner

*Primary Examiner* — Dao H Nguyen
(74) *Attorney, Agent, or Firm* — Canon U.S.A., Inc. IP Division

(57) ABSTRACT

A method includes forming a first layer containing silicon oxide on a first substrate, partially removing the first layer to form an exposure portion on the first substrate, depositing amorphous gallium nitride system compound semiconductor on the first substrate with the exposure portion, evaporating the semiconductor on the first layer to form cores of the semiconductor on the exposure portion of the first substrate, forming an epitaxial layer of the semiconductor on the first substrate, and removing the epitaxial layer of the semiconductor on the exposure portion on the first substrate to form a separating groove.

20 Claims, 21 Drawing Sheets

FIG.5A
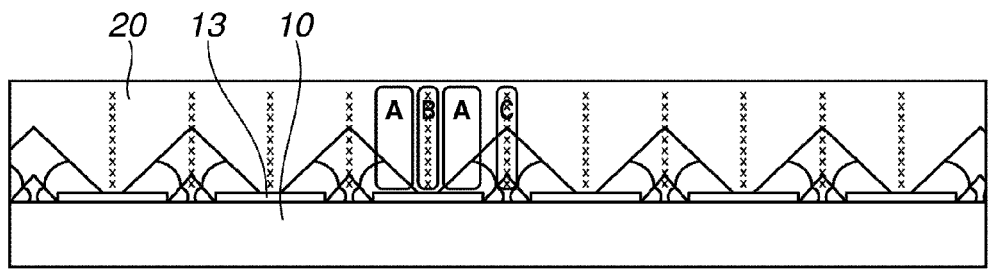
FIG.5B
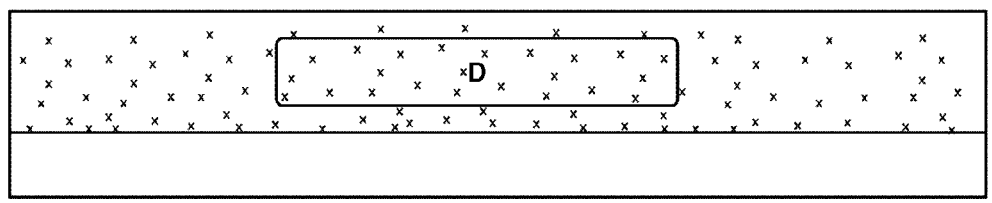
FIG.5C
| Zone | Area (a.u.) | Defect Density /cm² | Internal Efficiency in LED (a.u.) | External Effi. in LED (a.u.) | Total Effi. in LED (a.u.) |
|---|---|---|---|---|---|
| A | ~ 4 | $10^{6-7}$ | ~ 1.2 | ~ 1.1 (due to $SiO_2$) | ~ 1.32 |
| B | ~ 1 | $10^8$~$10^9$ | ~ 0.9 | ~ 1.1 | ~ 0.99 |
| C | ~ 1 | $10^8$~$10^9$ | ~ 0.9 | ~ 1.0 | ~ 0.90 |
| D | – | $10^7$~$10^8$ | 1.0 | 1.0 | 1.0 |

FORMING METHOD OF GALLIUM NITRIDE SYSTEM COMPOUND SEMICONDUCTOR LAYER, TRANSFER METHOD OF THE SAME, AND SUBSTRATE STRUCTURE WITH THE SAME BONDED THERETO

BACKGROUND OF THE INVENTION

1. Field of the Invention

The present invention relates to a forming method of a gallium nitride system compound semiconductor layer. Further, the present invention relates to light emitting devices (LEDs), electronic devices, LED arrays, LED printer heads, LED printers and the like fabricated using the forming method.

2. Related Background Art

Conventionally, a GaN epitaxial layer, that is a chief material for blue light emitting diodes and lasers, has been formed on a sapphire substrate or a single crystal substrate of silicon carbide (SiC) by the metal organic chemical vapor deposition (MOCVD) method. Devices using the GaN epitaxial layer are sold on the market. However, more than a half of the cost of the device is occupied by costs of its substrate and epitaxial layer. Thus, there exists a great obstacle of cost in application of such technology to the solid-state illumination in place of light bulbs and fluorescent lamps. For example, it has been reported that its cost is about several tens to hundred times as much as the cost of the light bulb, while its goods on the market are capable of illumination with a tenth of the power consumption of a 90-W light bulb, its life time is above 50,000 hours, and its performance largely surpasses that of the light bulb.

The sapphire substrate is most generally used as a single crystal underlayer wafer for growth of the GaN epitaxial layer (see Japanese Patent No. 2,628,404). Originally, the sapphire substrate has been developed as an underlayer substrate for silicon hetero epitaxial growth for the SOI (silicon-on-insulator) structure (so-called SOS (silicon-on-sapphire)) since 1960s. A large diameter wafer, such as an 8-inch wafer, has been developed. Thus, the technology in connection with the sapphire substrate is one of the most matured wafer technologies for the hetero epitaxial growth. However, as compared with the silicon wafer, the cost of the sapphire substrate is more than ten times as much, and hence its application range is limited, similar to the GaAs wafer. In other words, the cost of the silicon wafer is lowest, its quality is high, and its diameter is large. Further, for an optimal GaN system epitaxial growth, an 8-inch sapphire substrate is not yet usable, and only a 6-inch sapphire substrate can be presently used owing to its crystal quality. Thus, the 8-inch sapphire substrate cannot be said to be optimal for the growth of a semiconductor layer with a favorable crystal quality.

Further, the GaN single crystal epitaxial growth on the silicon substrate has been researched (see Japanese Patent Laid-open No. 2006-222402). However, due to crystal defects caused by a difference in the lattice constant, though this technology is applied to electronic devices such as transistors, it is difficult to apply to light emitting devices, such as LEDs and lasers, that are more vulnerable to crystal defects.

Furthermore, U.S. Pat. No. 6,420,242 discloses the following technology. In this technology, the GaN epitaxial layer grown on the sapphire substrate is heated with short-wavelength laser light applied from the bottom surface of the sapphire substrate, only a portion close to an interface between the GaN and the substrate is fused to be decomposed into metal Ga and nitrogen gas, and a device or device region is lifted off onto a dissimilar substrate. However, since the device region is successively transferred, its productivity is a great obstacle for acquisition of a large-area substrate. Thus, this technology is not easy to put to practical use.

As described above, the technology for forming the GaN epitaxial layer on the sapphire substrate may have an issue about costs. The technology for forming the GaN epitaxial layer on the silicon substrate or the like whose lattice constant is largely different that of the GaN may have an issue about crystal defects. And, the technology for transferring the GaN epitaxial layer grown on the sapphire substrate to the dissimilar substrate may have an issue about productivity.

SUMMARY OF THE INVENTION

According to one aspect of the present invention, a method includes: forming a first layer containing silicon oxide on a first substrate that is composed of a sapphire substrate or a SiC substrate; partially removing the first layer to form an exposure portion on the first substrate; depositing amorphous gallium nitride system compound semiconductor on the first substrate with the exposure portion; evaporating the semiconductor on the first layer to form cores of the semiconductor on the exposure portion of the first substrate; forming an epitaxial layer of the semiconductor on the first substrate through increase in a size of at least one of the core, combination of the cores, crystal growth, formation of facets, bending of dislocation lines, transverse crystal growth onto the first layer, collision between adjoining crystal grains, combination of the transversely grown crystals, formation of dislocation networks, and formation of a flat surface of the semiconductor; and removing the epitaxial layer of the semiconductor on the exposure portion on the first substrate to form a separating groove.

Further features of the present invention will become apparent from the following description of exemplary embodiments and examples, with reference to the attached drawings.

BRIEF DESCRIPTION OF THE DRAWINGS

FIG. 5A is a cross-sectional view illustrating the first substrate with the gallium nitride system compound semiconductor layer formed thereon in a processing step of the forming method.

FIG. 5B is a cross-sectional view illustrating a comparative example.

FIG. 5C is a table showing characteristics of the gallium nitride system compound semiconductor layers illustrated in FIGS. 5A and 5B.

DETAILED DESCRIPTION OF THE EMBODIMENTS

Embodiments of the present invention will hereinafter be described. A critical point of the forming method of the present invention is that starting from cores of the amorphous gallium nitride system compound semiconductor formed on the exposure portion of the first substrate with out the first layer, an epitaxial layer of the gallium nitride system compound semiconductor is formed on the first substrate by using the transverse crystal growth onto the first layer, and that the epitaxial layer of the gallium nitride system compound semiconductor on the exposure portion of the first substrate is removed.

Further, a critical point of the transfer method of the present invention is that the epitaxial layer of the gallium nitride system compound semiconductor formed on the first substrate by the above forming method is transferred to another substrate by etching an etching sacrificial layer of the first layer using its high selective etching property, and that the entire epitaxial layer or a portion thereof is transferred to still another substrate of the silicon substrate, metal substrate, or transparent substrate like a glass substrate, or the like by using the separation at the release layer between the above another substrate and the epitaxial layer.

Based on the above concept, the forming method of the present invention includes the steps described above.

The first to sixth steps of the forming method will be described. While the gallium nitride system compound semiconductor can be composed of GaN, AlGaN, GaInN or the like, the following description will be made for the compound semiconductor of GaN and the first substrate of a sapphire substrate. Further, while the first layer chiefly composed of silicon oxide can contain a little amount of silicon nitride and the like, the following description will be made for the first layer of $SiO_2$.

Figure 1A:
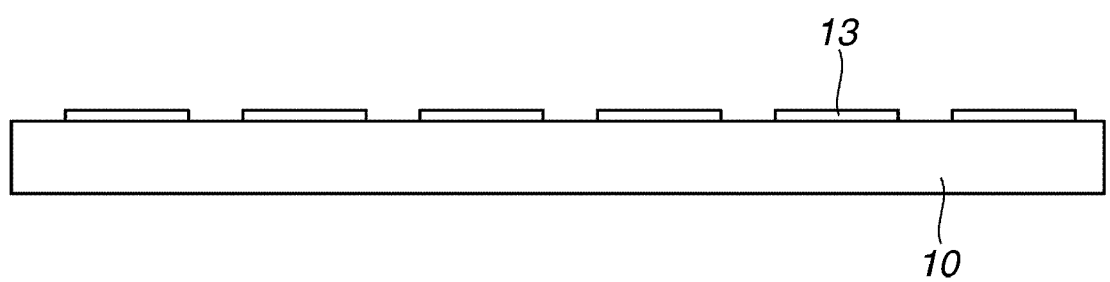
FIG. 1A is a cross-sectional view illustrating a first substrate in an embodiment of the forming method of a gallium nitride system compound semiconductor layer according to the present invention.
Figure 1B:
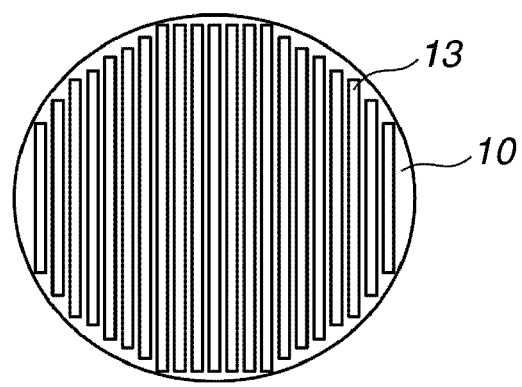
FIG. 1B is a plan view of FIG. 1A.

Initially, in the first and second steps, stripe-shaped layers 13 (e.g., shown in FIG. 1A) of $SiO_2$ are formed on a sapphire substrate 10 (e.g., shown in FIGS. 1A and 1B) of a diameter from 2 to 8 inches as illustrated in FIGS. 1A and 1B. The layers 13 of $SiO_2$ can be formed by sputtering, CVD using $SiH_4$, or the like. The layers 13 are shaped into stripe-shaped layers by etching. For example, the stripe-shaped layer 13 has a width of several tens microns and a thickness of below one (1) micron, and a distance between the stripes is several microns. Thereby, stripe-shaped exposure portions are formed on the sapphire substrate 10. It is important to form the stripe-shaped layers 13 of $SiO_2$ with the same width and the same thickness at a uniform inter-distance for formation of a flat surface of the gallium nitride system compound semiconductor described below.

Figure 2A:
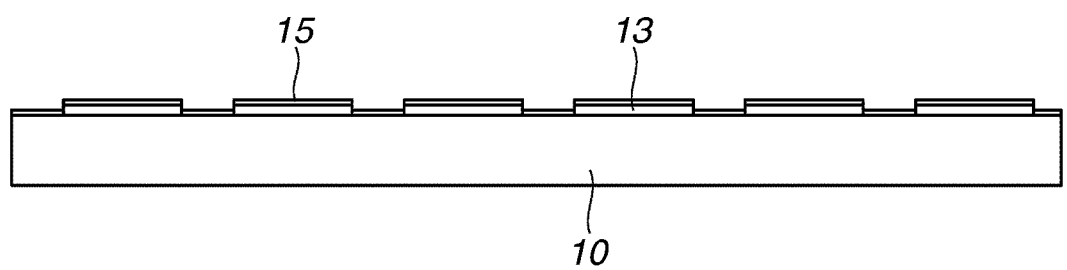
FIGS. 2A and 2B are cross-sectional views illustrating the first substrate in processing steps of the forming method.
Figure 2B:
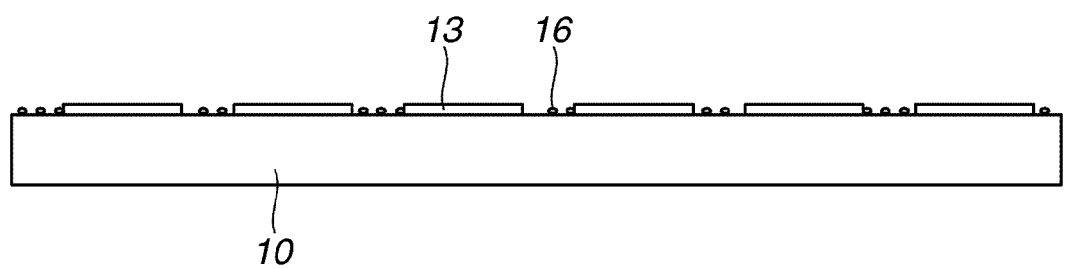

In the third and fourth steps, amorphous GaN 15 of a thickness of 25 nm is deposited on the sapphire substrate 10 with the exposure portions at a low temperature of, for example, 470 degrees centigrade by the MOCVD growth method, as illustrated in FIG. 2A. This step is performed in a reactor equipped with a susceptor for supporting the sapphire substrate 10, a heater, a tube for jetting a reactive gas, and the like, for example. Trimethylgallium (TMG) is used as a gas source of Ga, and an N-source ammonia is jetted out from the reactive gas jetting tube using hydrogen gas as carrier. Then, as illustrated in FIG. 2B, the temperature of the substrate is elevated to, for example, 1100 degrees centigrade to split the amorphous GaN 15, and the amorphous GaN 15 on the $SiO_2$ layer 13 is evaporated. Thus, cores 16 of the amorphous GaN are formed on the exposure portions of the sapphire substrate 10.

In the fifth step, TMG and source gas of ammonia are again introduced into the reactor. Thereby, increase in a size of the core 16 on the sapphire substrate 10, combination of the cores, crystal growth, formation of facets, bending of dislocation lines (see FIG. 3A), transverse crystal growth onto the first layer 13, collision between adjoining crystal grains, combination of the transversely grown crystals, formation of dislocation networks, and formation of a flat surface (see FIG. 3B) of the gallium nitride system compound semiconductor are executed. By those steps, an MOCVD epitaxial layer 20 of the gallium nitride system compound semiconductor is formed on the sapphire substrate 10. The thickness of the epitaxial layer 20 is coincident with the stripe width of the $SiO_2$ layer 13, and here it is about several tens microns. In place of the MOCVD gas phase growth method, the epitaxial layer of the gallium nitride system compound semiconductor can also be grown by the MBE method.

Figure 4:
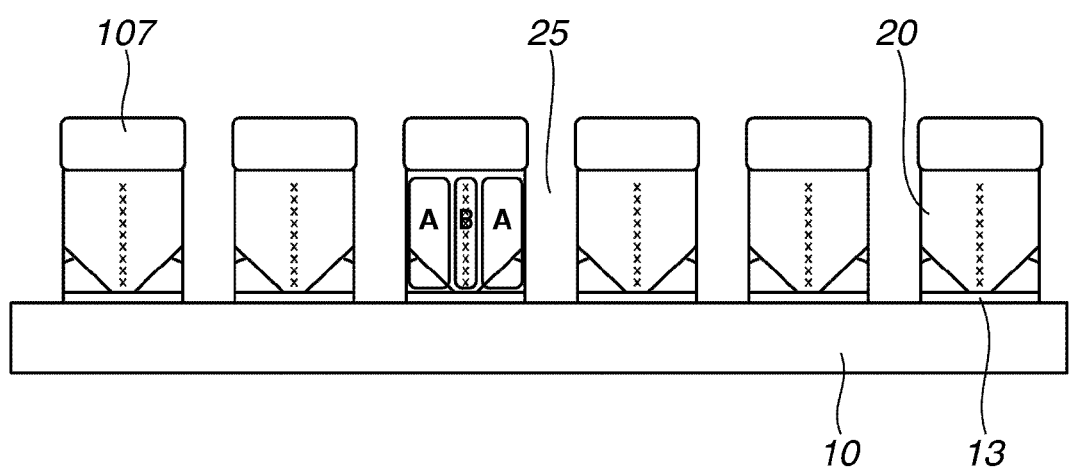
FIG. 4 is a cross-sectional view illustrating the first substrate with the gallium nitride system compound semiconductor layer having separating grooves formed therein in a processing step of the forming method.

In the sixth step, the epitaxial layer 20 of the gallium nitride system compound semiconductor on the exposure portion of the sapphire substrate 10 is removed to form a trench or a separating groove 25, as illustrated in FIG. 4. The separating groove 25 can be formed using a patterned resist mask 107 by the RIE (chlorine-based gas), or a trench forming method using a laser scriber, for example. Thus, the end portion of the $SiO_2$ layer 13 is exposed. The separating groove 25 serves as an etchant flow path at the time of selective etching described below. The separating groove 25 can also be formed by using an ordinary mechanical dicing apparatus, but a transfer of the epitaxial layer in an entire wafer scale becomes impossible in this case. However, when plural carrier segments acting as a second substrate are prepared, a transfer to a 12-inch silicon substrate having a diameter larger than the sapphire substrate can be performed by using a flip chip bonder, for example. This transfer is also useful.

Purposes of formation of the separating groove 25 will be described. One is for the formation of the etchant flow path, and another is for elimination of portions with a relatively large defect density. Comparison of defect density distributions in GaN epitaxial layer and efficiencies in LED will be described with reference to FIGS. 5A to 5C. FIG. 5A shows the GaN epitaxial layer 20 of this embodiment, and FIG. 5B shows a conventional GaN epitaxial layer grown on the entire surface of a sapphire substrate. Further, FIG. 5C shows areas, defect densities, internal quantum efficiencies in LED, external efficiencies in LED, and total efficiencies in LED of respective zones A, B, C and D illustrated in FIGS. 5A and 5B. As can be seen from FIG. 5C, the crystal quality of zone C in FIG. 5A is relatively low, so that the zone C is removed and only zones A and B are used for the fabrication of devices in this embodiment.

This removal of zone C results in generation of the separating groove 25, and hence the thus-generated separating groove 25 is also used to introduce the etchant to the end portion of the $SiO_2$ layer 13 of the etching sacrificial layer. The GaN epitaxial layer can be transferred to another substrate by etching the etching sacrificial layer. Thus, an expensive sapphire substrate becomes reusable, and the fabrication cost can be reduced. As compared with this embodiment, in the comparative example of FIG. 5B, though a GaN epitaxial layer whose crystal quality is approximately identical to the zone B in this embodiment, the sapphire substrate cannot be reused. Hence, the fabrication cost inevitably becomes relatively high.

Description will be made of an embodiment of the transfer method according to the present invention that includes the steps described above.

The third substrate is typically a silicon substrate, and the entire epitaxial layer or a portion thereof is transferred from the second substrate to the third substrate. In place of the above silicon substrate, a metal substrate can also be used. Where the metal substrate is used, the following points should be considered. In electronic devices, high frequency transistors, GaN system HEMTs usable as large output amplifiers and the like for radars and communications, device characteristics can be degraded due to large heat generation. Hence, SiC whose thermal conductivity is higher than sapphire and silicon is used in the application to devices having higher thermal conductivity.

Thus, the metal substrate is usable as a relatively low-cost substrate in place of the Si substrate or the like. Cu is effective, but a W/Cu alloy is more effective because it is important to fall a difference in coefficient of thermal expansion between the substrate and GaN within a given range. Al, W and Ti are also usable. Although the thermal conductivity is favorable, there are cases where stress is generated and the device is released from the metal substrate at the time of a heat processing step in fabricating the device or the time of heat generation of the device in use, due to a difference in the coefficient of thermal expansion. Therefore, selection of an optimal metal material is important in view of the matching of coefficient of thermal expansion and the heat resistivity of the substrate, considering conditions at the time of fabrication and use of the device.

Figure 6A:
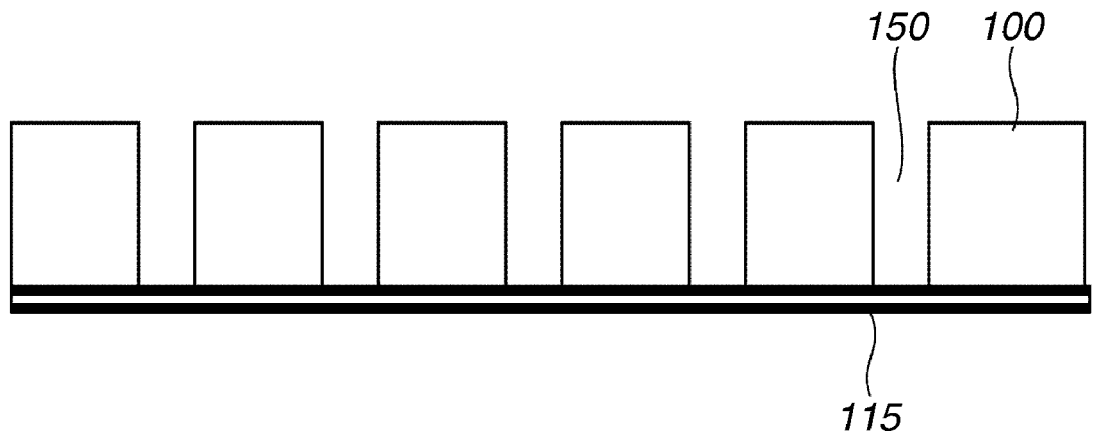
FIGS. 6A and 6B are cross-sectional views illustrating a second substrate.
Figure 6B:
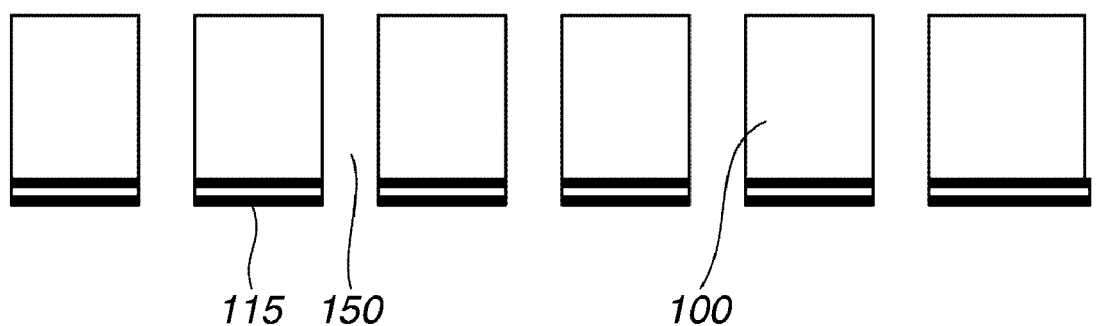
Figure 7:
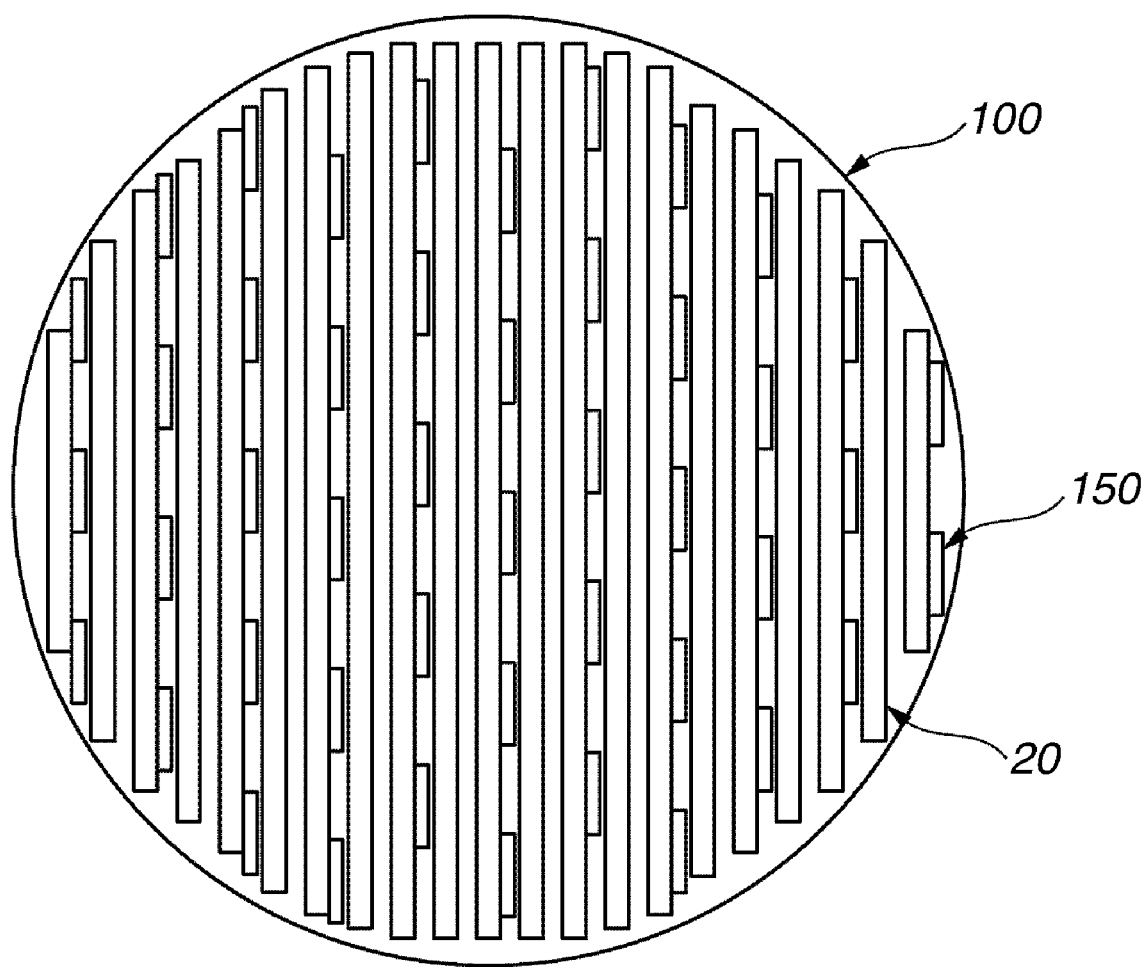
FIG. 7 is a plan view illustrating the positional relationship between penetrating grooves and strip-shaped gallium nitride system compound semiconductor layers.

The step of exposing the end portion of the first layer is the same as the step illustrated in FIG. 4. In the next step, the second substrate of, for example, a Si transfer wafer 100 is prepared, and a penetrating groove (the etchant flow path) 150 is formed as illustrated in FIGS. 6B and 7. A release layer 115 of, for example, a double-faced adhesive sheet is placed on one surface of the transfer wafer 100, and a hole is also formed in the release layer 115 as illustrated in FIG. 6B. The hole is connected to the penetrating groove 150.

The penetrating groove 150 can be formed by the sand blast (suitable where the thickness of the wafer 100 is over 50 microns), the laser scriber (suitable where the thickness of the wafer 100 is over 40 microns), RIE (Bosch process) (suitable where the thickness of the wafer 100 is below 40 microns), or the like. The hole in the double-faced adhesive sheet 115 can be formed by the laser processing. The double-faced adhesive sheet 115 can include a thermal releasable adhesive layer, a radiation releasable adhesive layer and the like, for example. The radiation releasable adhesive layer includes a material whose decomposition or decrease in bonding strength occurs when subjected to light irradiation. The thermal releasable adhesive layer includes a material whose decomposition or decrease in bonding strength occurs when subjected to heating or cooling.

Figure 8:
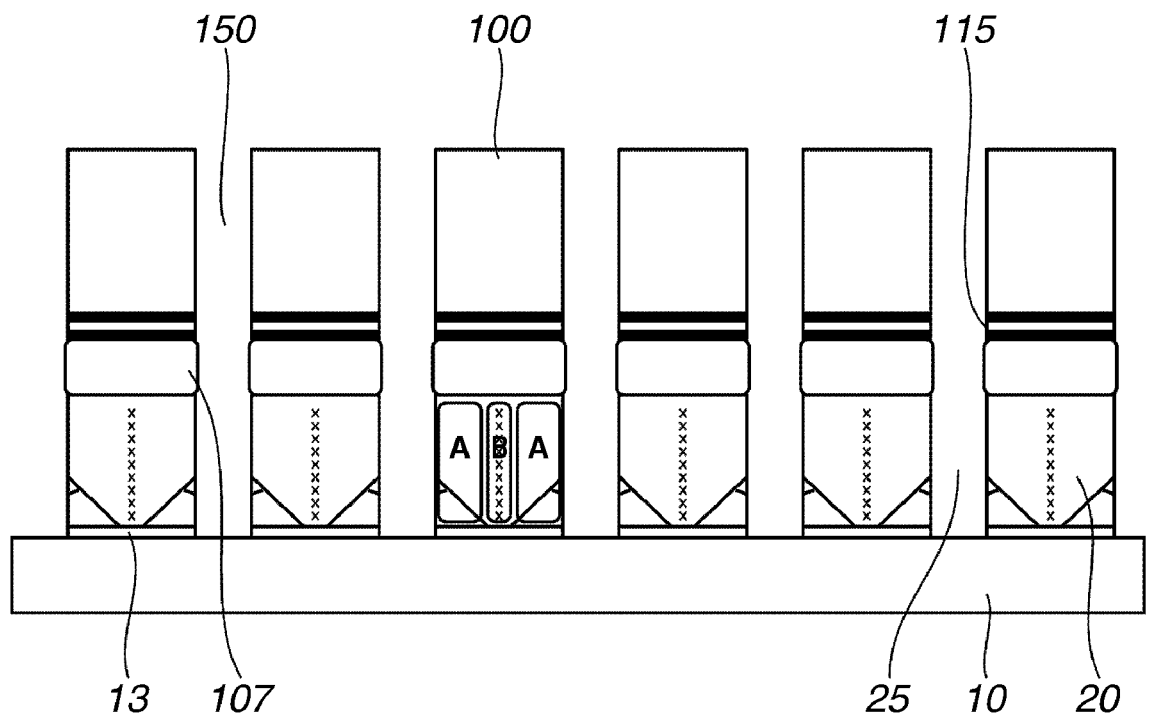
FIG. 8 is a cross-sectional view illustrating first and second substrates bonded to each other.

In the next step, the first substrate or sapphire substrate 10 with stripe-shaped GaN epitaxial layer 20 covered with a resist 107 is bonded to the second substrate or transfer wafer 100 by the release layer or double-faced adhesive sheet 115. The positional relationship between the penetrating groove 150 in the transfer wafer 100 and the stripe-shaped GaN epitaxial layer 20 in this state is illustrated in FIG. 7. Its cross section is illustrated in FIG. 8.

In the next step, the thus-bonded first substrate (sapphire substrate 10) and the second substrate (transfer wafer 100) is immersed in an etchant (HF solution), and the etchant is brought into contact with the first layer 13 through the penetrating groove 150 and the separating groove (trench) 25.

Figure 9:
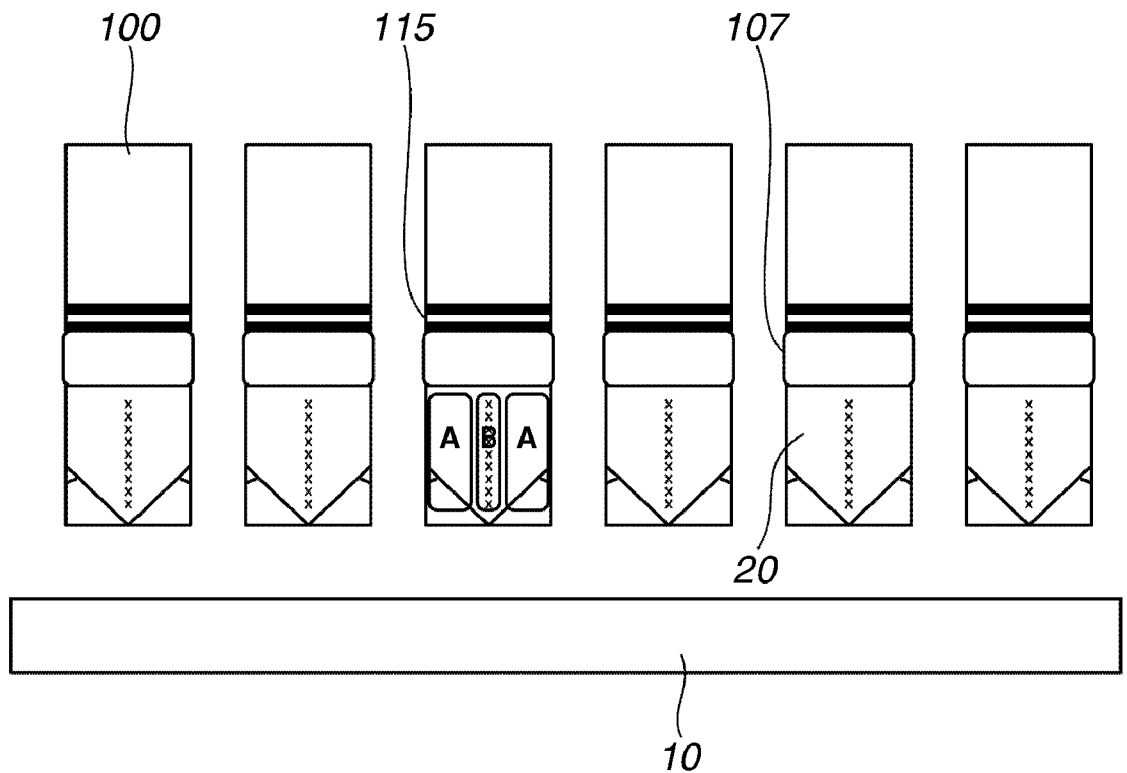
FIG. 9 is a cross-sectional view illustrating the gallium nitride system compound semiconductor layer transferred from the first substrate to the second substrates.

Thereby, as illustrated in FIG. 9, the first layer ($SiO_2$ layer) 13 is selectively etched, and the epitaxial layer 20 on the sapphire substrate 10 is transferred to the transfer wafer 100. Here, for the HF solution, the gallium nitride system compound semiconductor of GaN or the like has an infinite etching selectivity compared to $SiO_2$. Accordingly, the $SiO_2$ layer 13 is selectively etched completely. When a surface active agent is added to the etchant to improve the wetting property of the etchant, the etching rate can be effectively increased.

The thus-separated sapphire substrate 10 can be reused as a growth substrate. Since an expensive sapphire wafer is reusable, the fabrication cost of the gallium nitride system compound semiconductor layer can be reduced. Since the sapphire substrate is more stable, more stubborn and more heat resistive than the Si substrate and GaAs substrate, the sapphire substrate is highly resistive to the reuse. Compared to the melting point of 2050 degrees centigrade of the sapphire ($Al_2O_3$), those of Si and GaAs are 1420 degrees centigrade and 1238 degrees centigrade, respectively. Further, the coupling between aluminum atom and oxygen atom is strong, different from GaAs whose As atom is likely to selectively drop out. Thus, the sapphire is thermally stubborn, and physically rigid.

In the next step, the epitaxial layer 20 transferred to the second substrate (transfer wafer 100) is bonded to the third substrate (Si wafer 200). And, the second substrate is separated from the epitaxial layer at the release layer 115 to transfer the epitaxial layer from the second substrate to the third substrate. The entire epitaxial layer 20 can be transferred. Alternatively, a portion thereof can be selectively transferred.

Figure 10:
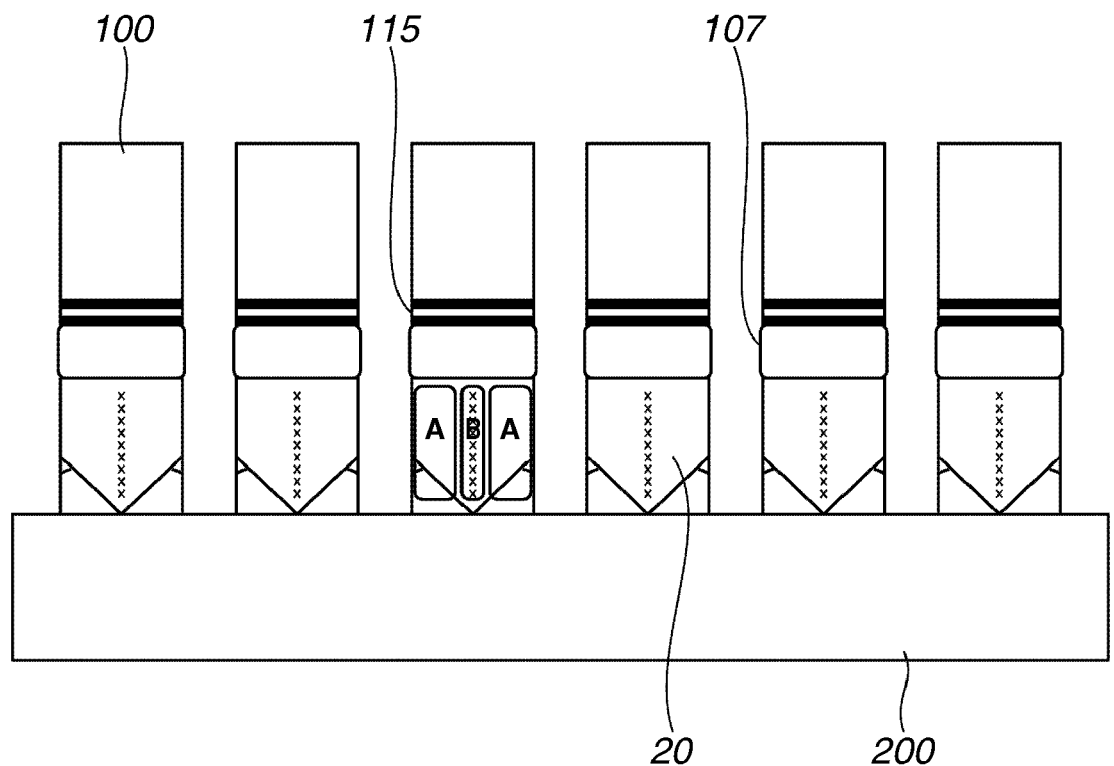
FIG. 10 is a cross-sectional view illustrating second and third substrates bonded to each other.
Figure 11:
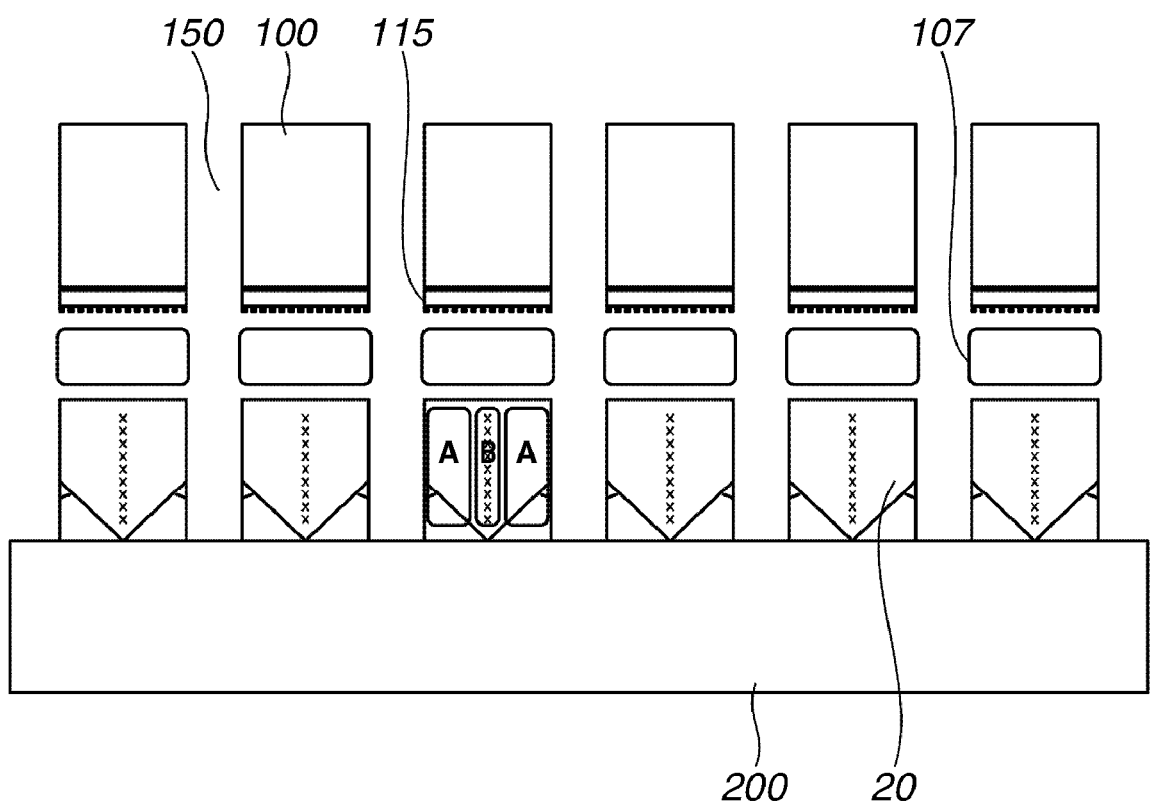
FIG. 11 is a cross-sectional view illustrating the gallium nitride system compound semiconductor layer transferred from the second substrate to the third substrates.

The former entire transfer will be described. FIG. 10 illustrates an example in which the epitaxial layer 20 is directly bonded to the silicon wafer (third substrate) 200 by the intermolecular force (van der Waals force). In this case, it is effective for an increase in the bonding force to subject the silicon wafer 200 to a surface plasma activation process using plasma active species such as argon, oxygen or nitrogen. Where the epitaxial layer 20 is applied to the LED, it is effective for an increase in efficiency of light output to interpose, for example, $SiO_2$ (it can change the refracting power) or a reflective layer at an interface between the silicon substrate 200 and the GaN-LED layer. In this case, an organic insulating layer (spin-on-polymer), whose tackness (adhesiveness) can be readily controlled, can be used. Further, sufficiently strong bonding can be achieved at low temperatures below 500 degrees centigrade by the organic insulating layer. When the epitaxial layer 20 is directly bonded to the silicon wafer 200, the covalent bond can be formed by thermal processing at temperatures above 500 degrees centigrade, and hence the bonding force can be increased.

Where the release layer 115 includes the heat releasable adhesive layer, the release layer 115 is heated to temperature above 100 degrees centigrade to separate the second substrate 100 from the epitaxial layer 20 at the release layer, as illustrated in FIG. 11. The transfer Si wafer 100 is separated by formation of bubbles in the thermal releasable adhesive layer. It is also possible to separate the second substrate 100 from the epitaxial layer 20 by removing the resist 107 by the asher. The thus-separated Si wafer 100 with penetrating groove 150 can be reused as the transfer wafer after the remaining release layer (double-faced sheet) 115 is removed, similarly to the sapphire substrate 10. This also can contribute to a decrease in the fabrication cost of the gallium nitride system compound semiconductor layer.

Further, a portion of the epitaxial layer 20 can be selectively transferred. In this case, a bonding layer (the organic insulating layer or the like) of a predetermined thickness is placed on at least one of a portion of the epitaxial layer 20 and a region on the third substrate 200 to which the epitaxial layer is transferred. And, the portion of the epitaxial layer 20 is bonded to the third substrate with the bonding layer. Then, only the portion bonded to the third substrate 200 with the bonding layer is separated from the second substrate 100 at the release layer 115.

Figure 12A:
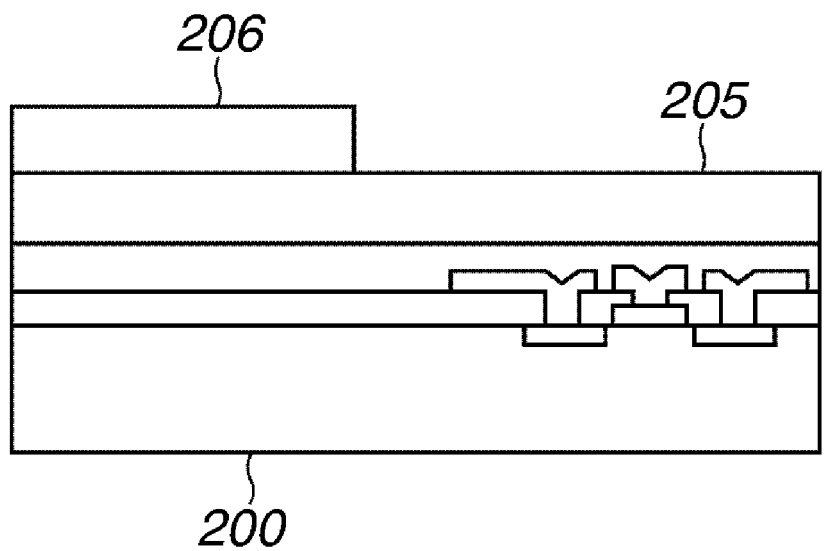
FIGS. 12A and 12B are cross-sectional views illustrating a step of forming a bonding layer on a third substrate.
Figure 12B:
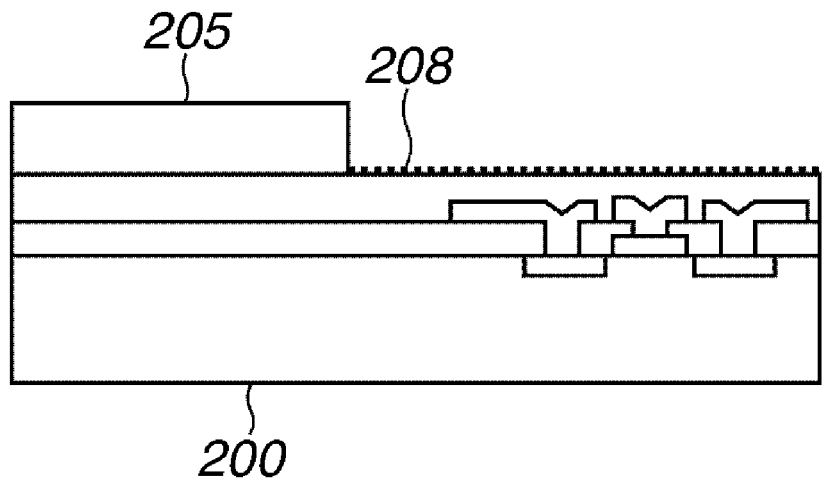

An example of the above steps will be described. A bonding layer 205 of a predetermined thickness is attached on at least one of the first functional region 101 (a portion of the epitaxial layer 20) to be selectively transferred and a region of a second substrate 200 to which the first functional region 101 is to be transferred. In this embodiment, as illustrated in FIGS. 12A and 12B, the bonding layer 205 is placed on the second substrate 200 of a silicon substrate with a driver circuit. Initially, as illustrated in FIG. 12A, the bonding layer 205 (for example, an organic insulating layer) is formed on the second substrate 200.

Then, the masking with a resist 206 is performed only to a transfer expected region of a first functional region 101 (see FIG. 13A) on the second substrate 200. As illustrated in FIG. 12B, the etching is executed by chemical etching or RIE to form the bonding layer 205 only on the transfer expected region of the second substrate 200, and the resist 206 is removed by the asher or the like. Here, the thickness of the bonding layer 205 is about 2.0 microns, and its surface is sufficiently smoothed. With such a thickness, a strong pressure of a second functional region 102 (see FIG. 13A) against a surface of the second substrate 200 can be prevented when the first functional region 101 is bonded to the bonding layer 205.

In this example, the thickness of the bonding layer 205 is approximately in a range from 1.0 micron to 10 microns. With a thickness below 1.0 micron, the bonding effect decreases. With a thickness above 10 microns, there is a possibility that the situation of wiring breakage at steps and the like arises when the functional region is electrically connected to the driver circuit and the like formed on the second substrate with the metal wiring after the functional region is transferred to the second substrate.

Further, the transfer method of this embodiment can include a step of forming a predetermined unevenness 208 on a surface in a region of the second substrate 200 other than the region to which the first functional region 101 is to be transferred, as illustrated in FIG. 12B, according to necessity. With such an unevenness 208, even if the second functional region 102 contacts with the surface of the second substrate 200 due to stress or the like at the time of bonding, the bonding between the second functional region 102 and the substrate 200 can be more effectively prevented. The unevenness 208 can be formed by over-etching performed when the bonding layer 205 is formed, for example. A surface of the unevenness 208 is sufficiently rough compared to the surface of the bonding layer 205. For example, smoothness $R_{pv}$ (the maximum of a peak-to-valley difference of unevenness) of the surface of the bonding layer 205 is below about 2 nm, and $R_a$ (the average of the peak-to-valley difference) is below about 0.2 nm. In contrast thereto, a surface roughness $R_{pv}$ of the unevenness 208 can be over about 2 nm, and $R_a$ of the unevenness 208 can be over about 0.2 nm.

As described above, plural island-like functional regions 101 and 102 are provided on the release layer 115 placed on the second substrate 100. In this example, the unevenness 208 is formed on the surface of the above region on the second substrate 200. The bonding layer 205 is formed of the organic material. As the organic material, there are polyimide and the like. An epoxy-based bonding layer can also be used. In place of the above organic material layer, spin-on-polymer and organic spin-on-glass (SOG) can also be used. In these materials, methyl radical, ethyl radical, phenyl radical or the like is added to an inorganic insulating oxidized layer like a silicon oxide layer, and the plasticity is thereby increased. For example, where the circuit region is formed on and/or in a silicon substrate of the second substrate 200, the following treatment can be performed. Using the organic SOG, the silicon oxide insulating layer for increasing flatness on the circuit region is formed on the second substrate 200 to a predetermined thickness, and is patterned. The silicon oxide insulating layer has a given stickiness at about the pre-bake temperature of 100 degrees centigrade.

In this example, such stickiness of the surface of the bonding layer 205 after the pre-bake process is beneficial for effective bonding in the following bonding step. Generally, tackness (stickiness or adhesiveness) is considered to appear owing to silanol group of hydrolysis radical, alkoxy group of organic component or the like contained in the organic insulating material (for example, spin-on-polymer). These constituents can cause junction or bonding strength between wafers or devices as dehydration-condensation reaction proceeds at process temperatures. With respect to the plasticity, non-hydrolysis radical out of the organic constituents contributes to stability of the plasticity of material at high temperatures (>400 degrees centigrade). Critical factors of the bonding are considered to be surface flatness and grains. In connection therewith, the flatness used to an underlayer with device structures and the bonding surface can be relaxed by the presence of the organic insulating layer having the plasticity and tackness.

Further, with respect to the influence of grains, grains of some sizes can be buried in the organic insulating layer due to its plasticity. Accordingly, the influence of grains can be substantially eliminated. The plasticity also greatly serves to relax the strain stored when the thickness of the layer is increased. When the amount of organic constituent for increasing the plasticity is small and a relatively thick layer (over one (1) micron) is formed, defects like cracks are likely to appear. For these reasons, when the amount of organic constituent in hydrolysis and non-hydrolysis radicals contained in the organic SOG is set to be above about 1 (one) wt. percent, appropriate stickiness and plasticity can be obtained. Accordingly, even a layer having a thickness in the micron order can be a stable layer.

As described above, the second substrate 200 is, for example, a semiconductor substrate, a silicon substrate, a silicon wafer with an oxidized layer on its surface, a silicon wafer provided with an electric circuit (for example, a driver circuit), or the like. Where an LED is fabricated including a compound semiconductor laminated layer, the driver circuit is, for example, a circuit for drive-controlling the LED. The silicon substrate can be a substrate with an epitaxial silicon layer on its surface, as well as a so-called CZ wafer. In place of the silicon substrate, a silicon-on-insulator (SOI) substrate can also be used.

Figure 13A:
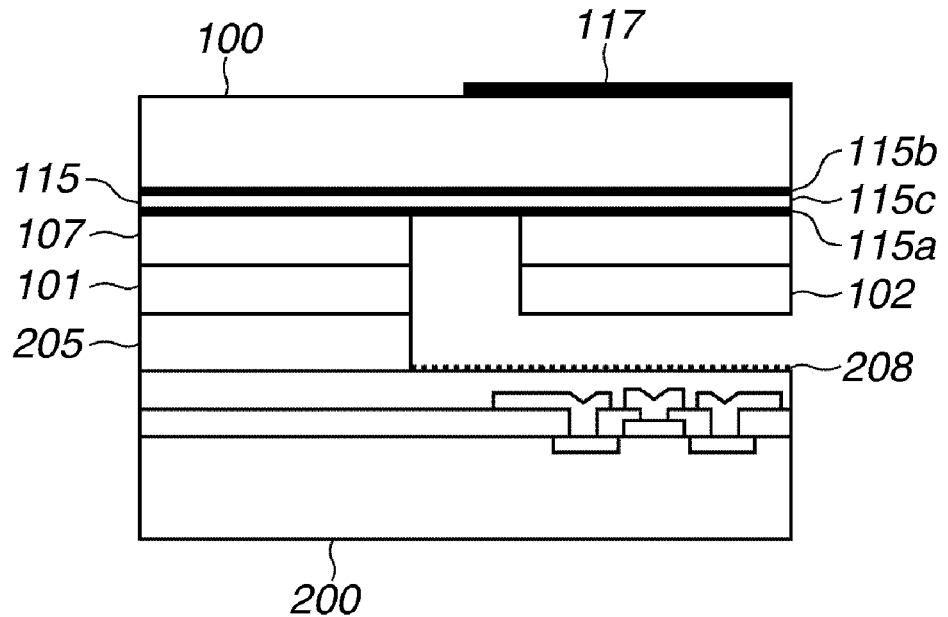
FIGS. 13A and 13B are cross-sectional views illustrating a step of selectively transferring the gallium nitride system compound semiconductor layer transferred on the second substrate to the third substrates.
Figure 13B:
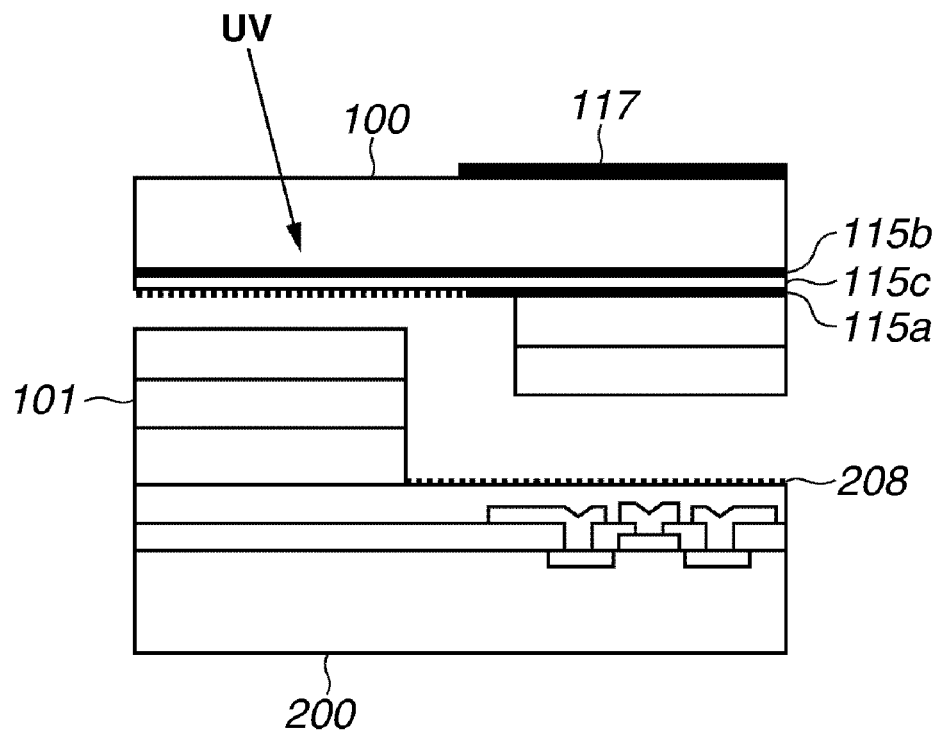

Description will be made of the step in which the first functional region 101 is bonded to the third substrate 200 by the bonding layer 205, and the step in which the second substrate 100 is separated from the first functional region 101 at the release portion or layer 115. As illustrated in FIG. 13A, the first functional region 101 on the release portion 115 placed on the second substrate 100 is aligned with and bonded to the bonding layer 205. As illustrated in FIG. 13B, the second substrate 100 is separated from the first functional region 101 at the release portion 115. In this example, the release layer 115 is a double-faced adhesive sheet which includes a UV releasable adhesive layer 115a on one surface of a sheet base material 115c and a thermal releasable adhesive layer 115b on the other surface of the sheet base material 115c. Here, irradiation of UV light is performed from a side of the transparent substrate 100 to cause decomposition or decrease in bonding strength of the UV releasable adhesive layer 115a. Thus, the second substrate 100 is separated from the first functional region 101. Due to the presence of a light blocking layer 117, no UV irradiation is executed to a portion of the release portion 115 corresponding to the second functional region 102. Therefore, the portion of the release layer 115a remains unchanged, and as illustrated in FIG. 13B, the second functional region 102 remains on the second substrate 100. In this step, UV laser light can be condensed to a fine spot, and scanned.

In this example, it is also possible to omit the light blocking layer 117, and perform entire light irradiation so that the second substrate 100 can be separated from the first functional region 101 at the releasable layer 115a. In this case, entire decomposition or decrease in bonding strength of the releasable layer 115a occurs, and the first functional region 101 bonded to the bonding layer 205 is separated from the second substrate 100 with the aid of this bonding force between the first functional region 101 and the bonding layer 205. At this time, also in a portion of the second functional region 102 not bonded to the second substrate 200, adhesiveness of the UV releasable adhesive layer 115a of the release portion 115 decreases. However, no peeling force from the second substrate 200 acts on the second functional region 102, so that the second functional region 102 remains on the second substrate 100.

When conditions (for example, material of the release layer, wavelength of irradiated light, light intensity, irradiation time and the like) are appropriately determined, this method can be readily performed at relatively low cost while maintaining reliability, without using the light blocking layer. In the case of such entire UV irradiation, an i-line (365 nm) UV lamp or an LED for generating UV light can be used. Also in this case, the second functional region 102 remaining on the second substrate 100 by the weakened UV releasable adhesive layer 115a of the release portion 115 can be further transferred to another substrate. Another substrate can be the second substrate, and the second functional region 102 is transferred to a portion of the second substrate 200 different from a portion to which the first functional region 101 has been already transferred.

Figure 15:
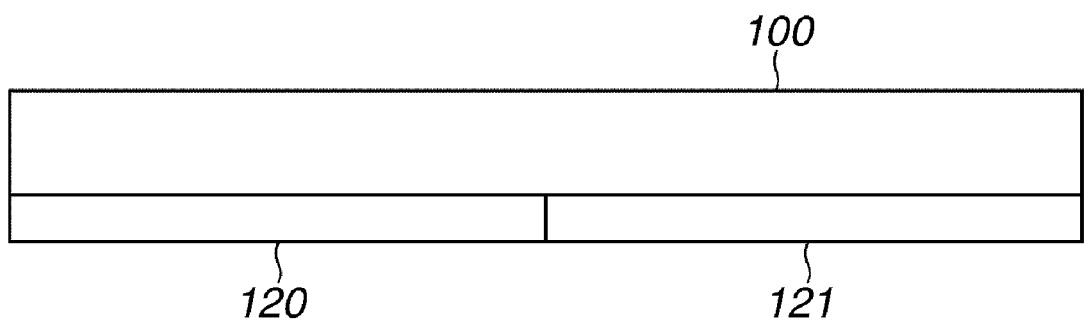
FIG. 15 is a cross-sectional view illustrating a combination of patterned release layers on a surface of a second substrate.

The release portion 115 can have another configuration. For example, the UV releasable adhesive layer 115a and thermal releasable adhesive layer 115b can be inverted. The release portion 115 can also be composed of a UV or thermal releasable adhesive layer and a pressure sensitive releasable adhesive layer. Further, as illustrated in FIG. 15, release layers 120 and 121 with different properties can be attached on the second substrate 100, corresponding to the first and second functional regions 101 and 102, respectively. For example, one is a UV releasable adhesive layer, and the other is a thermal releasable adhesive layer. Alternatively, one is a first radiation releasable adhesive layer, and the other is a second radiation releasable adhesive layer whose decomposition or decrease in bonding strength occurs by irradiation of light at a wavelength different from that of the first radiation releasable adhesive layer. Furthermore, one is a first thermal releasable adhesive layer, and the other is a second thermal releasable adhesive layer whose decomposition or decrease in bonding strength occurs at temperature different from that of the first radiation releasable adhesive layer.

The release portion 115 with the releasable adhesive layers can be formed on the second substrate 100 by vacuum evaporation or the like, instead of using a sheet. More specifically, the release layer can be formed of a material containing thermal foaming capsules. The UV releasable adhesive material can be a material whose cross-link breaks due to UV energy irradiation, or a material containing capsules capable of being foamed by absorption of UV light. The thermal releasable adhesive material can be REVALPHA (product name by NITTO DENKO), or the like.

Figure 14A:
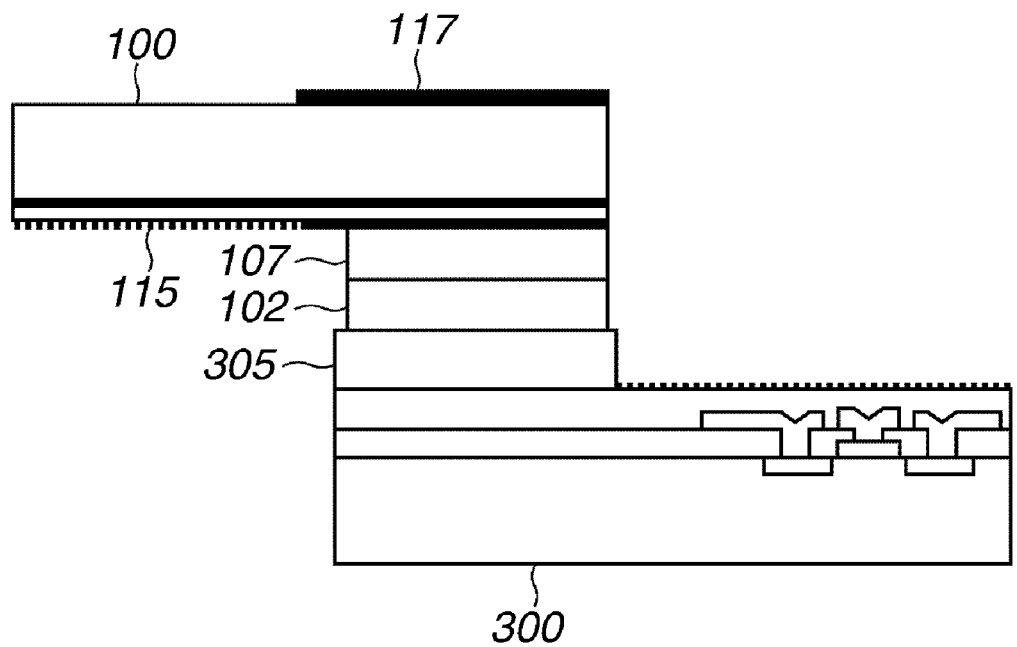
FIGS. 14A and 14B are cross-sectional views illustrating a step of selectively transferring the gallium nitride system compound semiconductor layer transferred from the second substrate to a fourth substrates.

When the second functional region 102 is transferred to still another substrate, substantially the same process as that for transfer of the first functional region 101 can be performed. In other words, as illustrated in FIG. 14A, a bonding layer 305 (for example, the organic insulating layer) is formed on a fourth substrate 300, and the masking with a resist layer is executed only to a transfer region of the second functional region 102. Then, the etching is executed by chemical etching or RIE to form the bonding layer 305 only on the transfer expected region of the substrate 300.

Figure 14B:
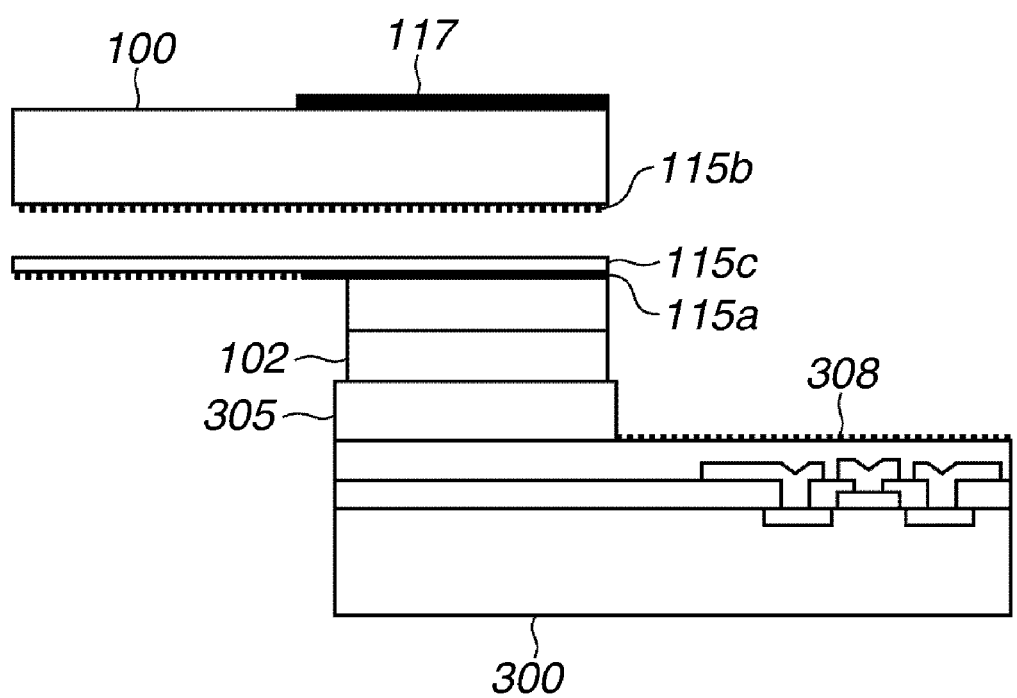

Next, as illustrated in FIG. 14A, the second functional region 102 is aligned with and bonded to the bonding layer 305. As illustrated in FIG. 14B, the second substrate 100 is separated from the second functional region 102 at the releasable layer 115b. Here, the releasable layer 115b is subjected to heating at about 170 degrees centigrade to cause decomposition or decrease in bonding strength of the thermal releasable adhesive layer 115b of the release layer 115. Thereafter, the resist 107 is removed by the lift-off.

Description will be made to examples directed to an LED device, an LED array, an LED printer head, and an LED printer using the gallium nitride system compound semiconductor layer formed by the method of the present invention.

The example of the LED uses the epitaxial layer 20 of the gallium nitride system compound semiconductor transferred to the Si substrate. This device is a blue (fluorescent white) illumination solid-state LED. This LED device has a configuration illustrated in FIG. 16. From a device surface, there are arranged an ITO transparent electrode 410, a p-type GaN contact layer 412, an InGaN multiple quantum well active layer 414, an n-type GaN contact layer 416, an $n^+$-low resistance Si substrate 200, and a bottom surface Al electrode 418.

Figure 3A:
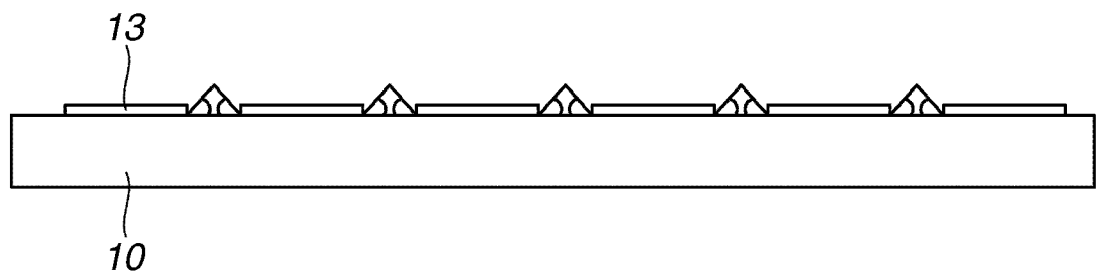
FIGS. 3A and 3B are cross-sectional views illustrating the first substrate with the gallium nitride system compound semiconductor layer formed thereon in processing steps of the forming method.
Figure 3B:
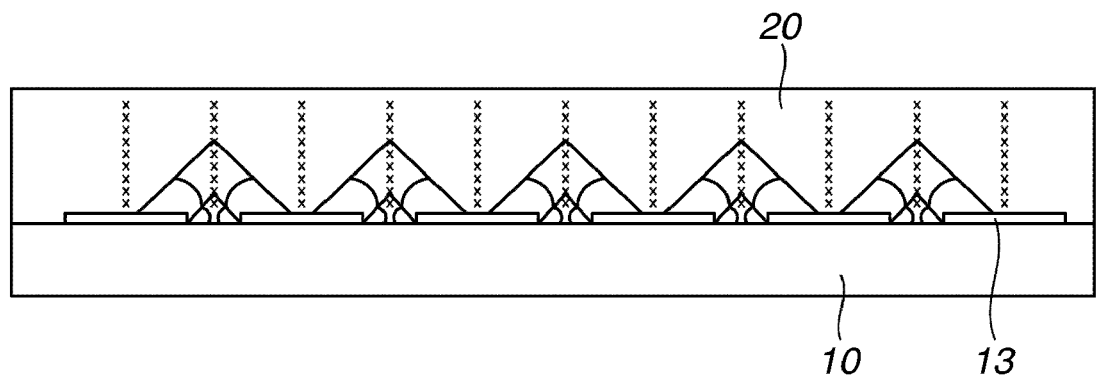
Figure 16:
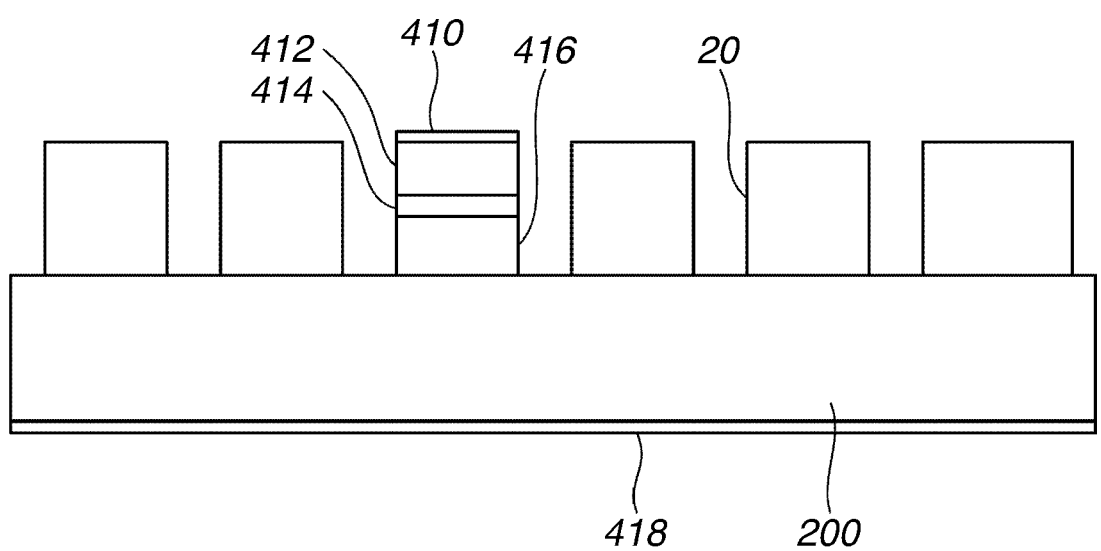
FIG. 16 is a cross-sectional view illustrating an LED device using the gallium nitride system compound semiconductor layer transferred on a Si substrate by the transfer method according to the present invention.

The structure of such an epitaxial layer 20 can be fabricated by appropriately changing temperature, source gas and the like in the reactor in the above-described forming step illustrated in FIGS. 3A and 3B. For example, the multiple quantum well active layer 414 and the p-type GaN contact layer 412 can be fabricated on the first substrate 10 in the following step. Initially, $In_{0.02}Ga_{0.98}N$ barrier layer is formed at the growth temperature of 840 degrees centigrade. Then, five $In_{0.15}Ga_{0.85}N$ well layers of a thickness 3 nm, and five $In_{0.02}Ga_{0.98}N$ barrier layers of a thickness 9 nm are alternately formed. Thereafter, the growth temperature is elevated to 1000 degrees centigrade, and Mg-doped p-type GaN layer 412 of a thickness 200 nm is formed. FIG. 16 shows the structure wherein the thus-fabricated epitaxial layer 20 is transferred to the Si substrate 200. Trimethylgallium (TMG) is used as the source gas to form GaN, and TMG and trimethylindium (TMIn) are used as the source gas to form InGaN. Further, when GaAlIn is to be formed, trimethylaluminum (TMAl) is also used as the source gas.

Compared to a conventional LED formed on the sapphire substrate, the LED of this example has the following characteristics.

The substrate bottom surface electrode 418 can be formed, and hence the number of electrodes 410 on the surface side can be reduced to a half of the conventional one. Accordingly, a light emitting region of the device can be enlarged. In order to improve the output efficiency, insertion of $SiO_2$ for a change in refractive index and reflective mirror (Al, Ag or the like) into an interface of the substrate 200 can be performed by the bonding method. The sapphire substrate (first substrate 10) with physical and thermal stability can be reused, and hence the fabrication cost can be greatly reduced.

The example of a blue LED solid-state scanner for electrophotography or the like also uses the epitaxial layer 20 of the gallium nitride system compound semiconductor transferred to the Si substrate. This device (LED/CMOS driver circuit) has a configuration illustrated in FIG. 17. From a device surface, there are arranged a p-type Au/Ni electrode 510, a p-type GaN contact layer 512, an InGaN quantum well active layer 514, an n-type GaN contact layer 516, an n-type Au/Ni electrode 518, and a Si substrate 200 with a built-in CMOS driver circuit.

Figure 17:
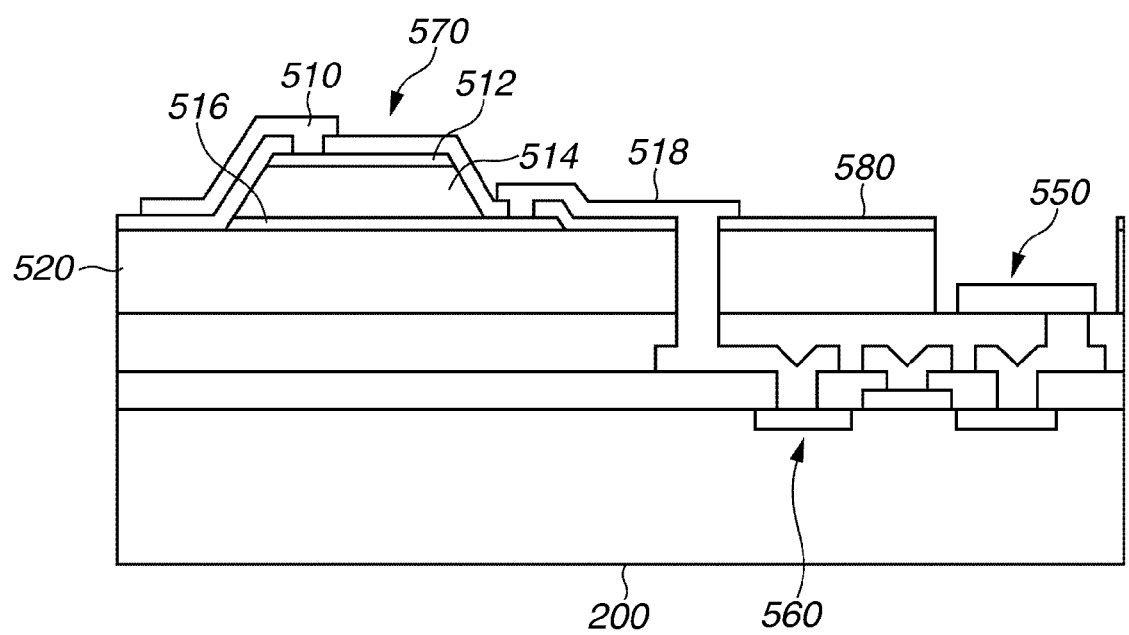
FIG. 17 is a cross-sectional view illustrating a blue LED solid-state scanner using the gallium nitride system compound semiconductor layer transferred on a Si substrate by the transfer method according to the present invention.

Here, the driver IC (driver circuit) is connected to the LED device. In the configuration of FIG. 17, an insulating layer 520 of an organic material (see the bonding layer 205 in FIGS. 13A and 13B) is formed on the silicon substrate 200 with a MOS transistor 560 constituting the driver IC. An LED light emitting region 570 including the gallium nitride system compound semiconductor laminated layer is provided on the insulating layer 520. Further, reference numeral 580 denotes another insulating layer, reference numeral 550 denotes a wire bonding pad forming a source or drain region of the MOS transistor 560. Such a configuration can be fabricated from the structure of the third substrate 200 as illustrated in FIG. 13B, for example.

Compared to a conventional infra-red LED (wavelength of 760 nm) formed on the GaAs substrate, the LED device of this example has the following characteristics.

Conventionally, a laser or LED is used as an infra-red (wavelength of 750 nm) light source for electrophotography. In contrast thereto, when a blue-range (a half wavelength) light source is used, the spot size can be halved. That is, provided that the wavelength is about 450 nm, the spot diameter of 10 microns corresponding to True 2400 dpi can be achieved. Since the drive circuit for the LED array can be built in the underlayer silicon, the number of bonding wires can be greatly reduced. Accordingly, the cost of the entire head unit can be greatly decreased. The sapphire substrate with physical and thermal stability can be reused, and hence the fabrication cost can be greatly reduced.

Further, where a ratio of density between the gallium nitride system compound semiconductor layer on the third substrate and the gallium nitride system compound semiconductor layer densely arranged on the second substrate is 1: n in the transfer method, the growth substrate can be efficiently used, and hence the cost can be further reduced. Further cost reduction can be expected where the selective transfer of plural active layers on a single substrate is performed in the transfer method.

Figure 18:
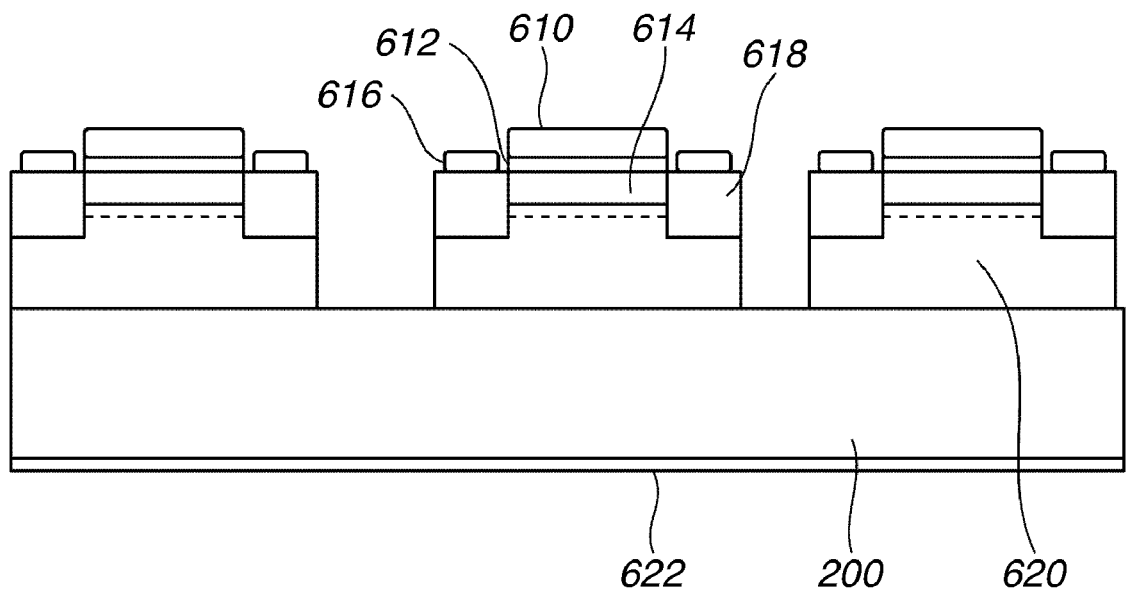
FIG. 18 is a cross-sectional view illustrating a GaN transistor, such as HEMT (High Electron Mobility Transistor) or MIS (Metal-Insulator Semiconductor), using the gallium nitride system compound semiconductor layer transferred on a Si substrate by the transfer method according to the present invention.

The example of a GaN transistor (HEMT or MIS) also uses the epitaxial layer 20 of the gallium nitride system compound semiconductor transferred to the Si substrate. This device has a configuration illustrated in FIG. 18. From a device surface, there are arranged an Al gate electrode 610, a $SiO_2$ insulating layer 612, an undoped AlGaN active layer 614, a Ti/Al source electrode 616, an $n^+$-source region 618 (Si-ion implanted) 618, an i-GaN layer 620, an $n^+$-low resistance Si substrate 200, and a bottom surface Al electrode 622.

Compared to a conventional LED formed on the sapphire substrate, the device of this example has the following characteristics.

The substrate bottom surface electrode 622 can be formed, so that the potential of the device layer is not floated, and can be determined and controlled. Therefore, stability and reliability of the device operation can be improved. The silicon circuit (CMOS, bi-polar, high voltage-resistive FET or the like) can be fabricated and connected in the underlayer Si substrate 200. The sapphire substrate with physical and thermal stability can be reused, and hence the fabrication cost can be greatly reduced. The defect density can be reduced less than a GaN/Si directly grown on Si, so that the property, reliability, uniformity, and yield of the device can be improved. Compared to a conventional GaAs-HEMT, the above GaN-HEMT can construct a large-output amplifier in the C-band of several GHz. Accordingly, it can contribute to downsizing and reduction in power consumption of cellular phone base stations, satellite communications apparatuses, radar transmitters and the like.

Figure 19:
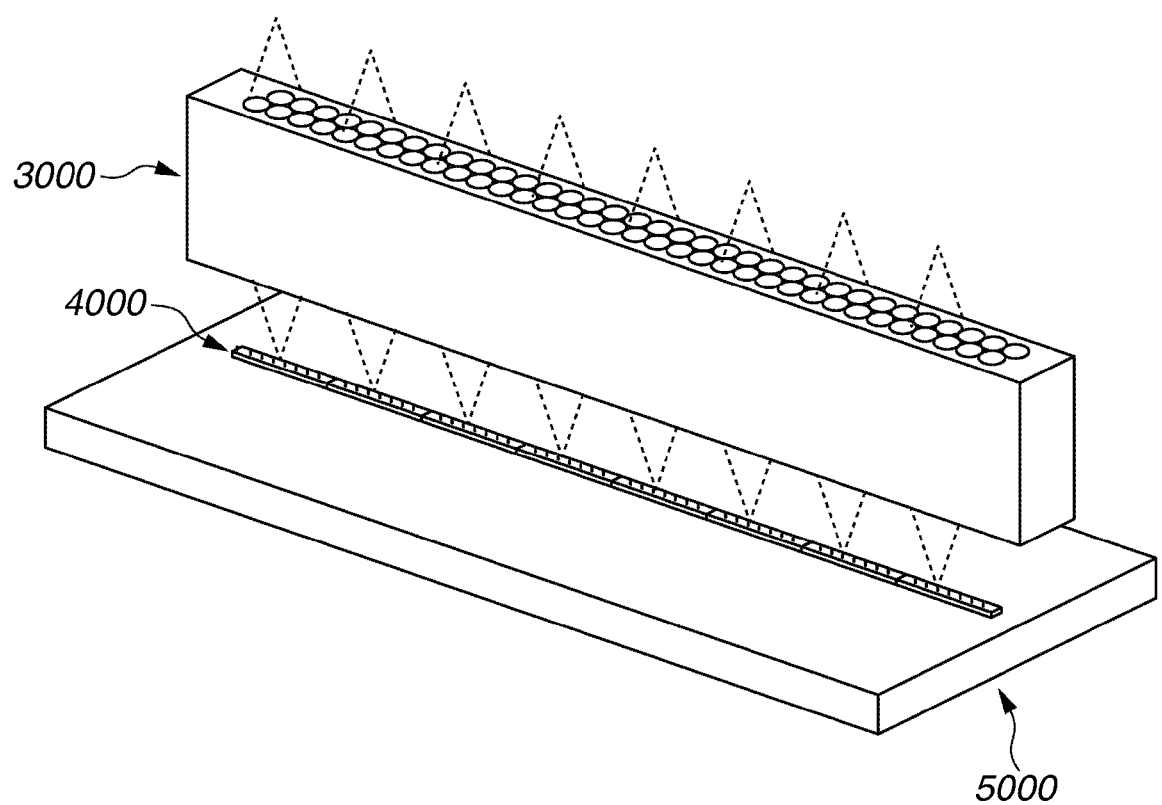
FIG. 19 is a perspective view illustrating an example of an LED printer head.

The example of an LED array fabricated by using the above forming method and transfer method of the gallium nitride system compound semiconductor layer will be described. The LED array as illustrated in FIG. 19 can be achieved by using the above forming method and transfer method. FIG. 19 shows a structure wherein the drive circuit and an LED array 4000 are connected and arranged on a print-circuit board 5000. The drive circuit and LED array can be obtained using the transfer method of the transfer method of the gallium nitride system compound semiconductor layer, in the following manner. Plural LED devices are formed on the silicon substrate as illustrated in FIGS. 13A and 13B, and plural portions acquired by division of the silicon substrate using dicing are arranged on the print-circuit board 5000. Cross sectional structures of each LED device and each drive circuit are similar to the LED device including the LED light emitting region and the driver circuit illustrated in FIG. 17.

In the structure of FIG. 19, plural sets of LED array/drive circuits 4000 are linearly arranged on the print-circuit board 5000. In the LED array/drive circuit 4000, the LED device and the driver device of driver IC are electrically connected as illustrated in FIG. 17. A rod lens array 3000 (for example, SLA: Selfoc lens array) can be placed facing the LED array 4000 according to necessity. Thus, the LED printer head can be fabricated. Light emitted from the linearly-arranged LED array 4000 is condensed by the rod lens array 3000 to achieve image formation by the LED array.

Where LED device constituent layers are formed on the silicon substrate interposing a metal layer or DBR mirror therebetween, a fine light spot can be obtained owing to improvement of the directional property. In such a case, the LED printer head can be set up without using the rod lens array.

Figure 20:
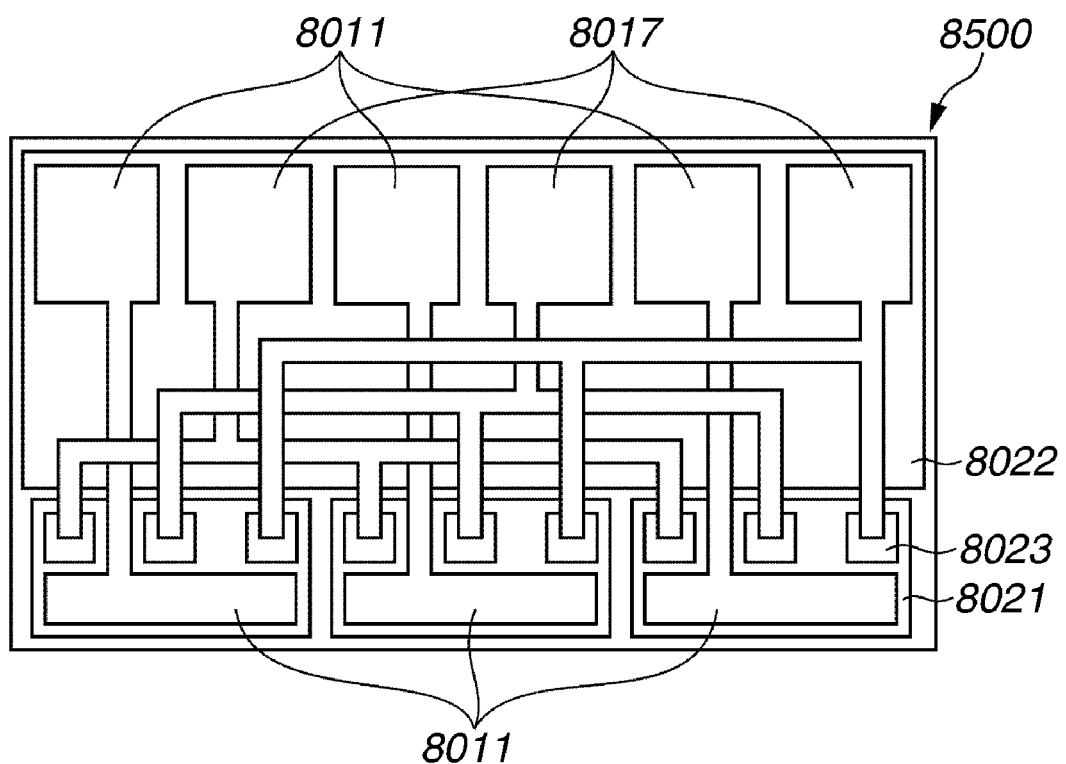
FIG. 20 is a plan view illustrating a light emitting device array circuit capable of being driven in a time sharing manner so that the number of electrodes can be reduced.

FIG. 20 illustrates a structure for matrix driving. A light emitting device array circuit 8500 in FIG. 20 can be driven in a time sharing manner for reducing the number of electrodes. In FIG. 20, reference numeral 8011 denotes an n-type electrode, reference numeral 8017 denotes a p-type electrode, reference numeral 8021 denotes an insulating layer on n-type AlGaAs, reference numeral 8022 denotes an insulating layer on p-type GaAs contact layer, and reference numeral 8023 denotes a light emitting region.

Low-cost high-performance LED array and LED printer head described above can be achieved by using the forming method and transfer method of the gallium nitride system compound semiconductor layer according to the present invention.

Figure 21A:
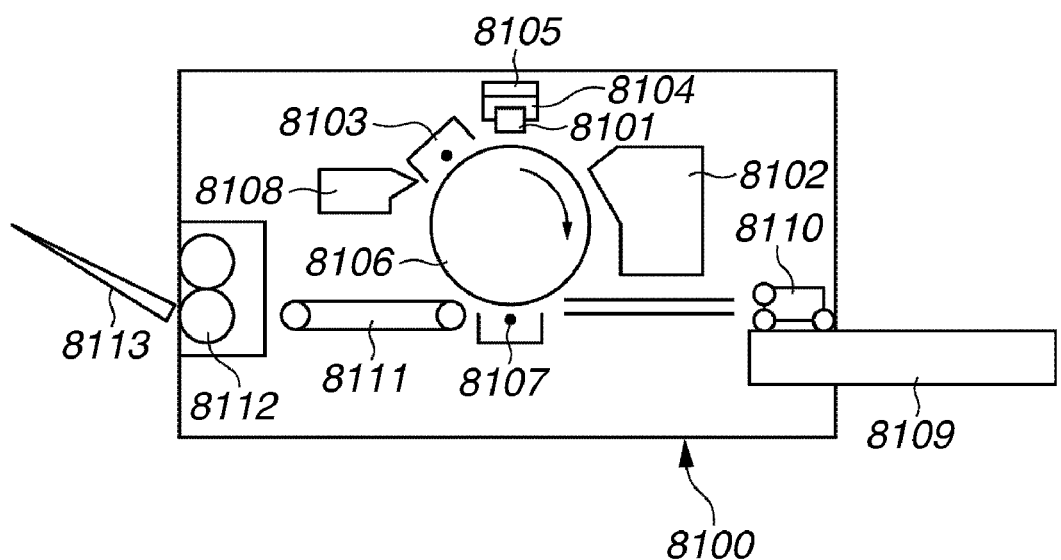
FIG. 21A is a view illustrating a configuration of an example of an LED printer.

FIG. 21A shows the example of an LED printer using the LED printer head described above. The LED printer includes the LED printer head, a photosensitive drum, and an electrostatic charging device. An image forming unit forms an electrostatic latent image on the photosensitive drum by using a light beam from a light source of the LED printer head.

In FIG. 21A of a schematic cross-sectional view showing a configuration of the LED printer, the photosensitive drum 8106 rotatable in a clockwise direction is placed in a printer body 8100. Above the photosensitive drum 8106, the LED printer head 8104 is arranged for exposure of the photosensitive drum. The LED printer head 8104 includes an LED array 8105 with plural light emitting diodes each emitting light according to an image signal, and a rod lens array 8101 for forming an image of radiation pattern of each light emitting diode on the photosensitive drum 8106. The rod lens array 8101 has the configuration described above. An image-formed plane of the light emitting diode is caused to coincide with a surface of the photosensitive drum 8106 by the rod lens array 8101. In other words, the optical conjugate relationship between the radiation surface of the light emitting diode and the photosensitive surface of the photosensitive drum is achieved by the rod lens array.

Around the photosensitive drum 8106, an electrostatic charging device 8103 for uniformly charging the surface of the photosensitive drum 8106, and a developing device 8102 for attaching toner to the photosensitive drum 8106 according to an exposure pattern by the printer head 8104 to form a toner image. There are further arranged a transfer electrostatic charging device 8107 for transferring the toner image to a transfer material like a copy sheet, and a cleaning portion 8108 for collecting waste toner remaining on the photosensitive drum 8106 subsequent to the transfer.

Further, in the printer body 8100, a sheet cassette 8109 for containing the transfer material, and a sheet feeding portion 8110 for feeding the transfer material to a location between the photosensitive drum 8106 and the electrostatic charging device 8107 are arranged. Furthermore, there are arranged a fixing device 8112 for fixing the transferred toner image on the transfer material, a conveying portion 8111 for conveying the transfer material to the fixing device 8112, and a sheet discharging tray 8113 for supporting the transfer material discharged subsequent to the fixation.

Figure 21B:
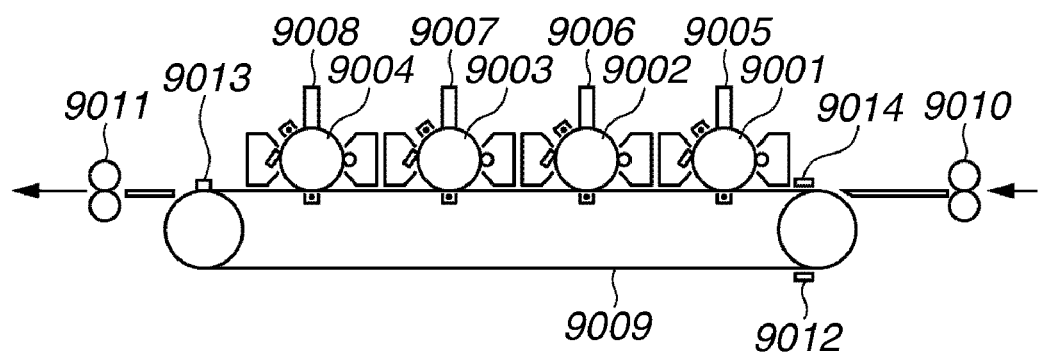
FIG. 21B is a view illustrating a configuration of an example of an LED color printer.

The example of an LED color printer will be described. The LED color printer includes plural sets of the LED printer head, the photosensitive drum, the electrostatic charging device, and the image forming unit for forming the electrostatic latent image on the photosensitive drum by using the LED printer head as a light source. FIG. 21B shows a schematic configuration of the LED color printer. In FIG. 21B, reference numerals 9001, 9002, 9003 and 9004 denote photosensitive drums of magenta (M), cyan (C), yellow (Y), and black (K), respectively. Reference numerals 9005, 9006, 9007 and 9008 denote respective LED printer heads. Reference numeral 9009 denotes a conveyer belt for conveying the transfer material and bringing the transfer material into contact with respective photosensitive drums 9001, 9002, 9003 and 9004. Reference numeral 9010 denotes a registration roller for feeding the sheet, and reference numeral 9011 denotes a fixing roller.

Further, reference numeral 9012 denotes a charger for adsorption-supporting the transfer material on the conveyer belt 9009, reference numeral 9013 denotes a charge eliminating device, and reference numeral 9014 denotes a sensor for detecting a leader of the transfer material.

Low-cost high-performance LED printer described above can be achieved by using the forming method and transfer method of the gallium nitride system compound semiconductor layer according to the present invention.

The present invention can be applied to an array device wherein semiconductor devices of the gallium nitride system compound semiconductor layer are arranged in an array on a semiconductor substrate. Particularly, the present invention can be applied to an LED printer, a display apparatus, an optical transceiver device, an optical receiver device, and the like using LED devices with the gallium nitride system compound semiconductor layer formed on a semiconductor substrate. In the case of the optical receiver device, a reliable scanner can be provided.

Except as otherwise discussed herein, the various components shown in outline or in block form in the Figures are individually well known and their internal construction and operation are not critical either to the making or using, or to a description of the best mode of the invention.

This application claims the benefit of Japanese Patent Application No. 2008-282794, filed Nov. 4, 2008, which is hereby incorporated by reference herein in its entirety.

What is claimed is:

1. A forming method of forming a gallium nitride system compound semiconductor layer, the method comprising:
    forming a first layer containing silicon oxide on a first substrate of a sapphire or a SiC substrate;
    partially removing the first layer to form an exposure portion on the first substrate;
    depositing amorphous gallium nitride system compound semiconductor on the first substrate with the exposure portion;
    evaporating the semiconductor on the first layer to form cores of the semiconductor on the exposure portion of the first substrate;
    forming an epitaxial layer of the semiconductor on the first substrate through increase in a size of at least one of the cores, combination of the cores, crystal growth, formation of facets, bending of dislocation lines, transverse crystal growth onto the first layer, collision between adjoining crystal grains, combination of the transversely grown crystals, formation of dislocation networks, and formation of a flat surface of the semiconductor; and
    removing the epitaxial layer of the semiconductor on the exposure portion on the first substrate to form a separating groove, wherein
    a portion of the epitaxial layer is selectively transferred using a bonding layer of a predetermined thickness placed on the portion, and the predetermined thickness is approximately in a range from 1.0 micron to 10 microns.

2. The forming method according to claim 1, wherein the semiconductor includes at least one of GaN, AlGaN and GaInN.

3. A transfer method of transferring the gallium nitride system compound semiconductor layer obtained on the first substrate by the forming method according to claim 1 to another substrate, the method comprising:
    exposing an end portion of the first layer on the first substrate;
    preparing a second substrate with a release layer capable of falling in a releasable condition when subjected to a predetermined process formed thereon and a penetrating groove formed therein;
    bonding the first substrate to the second substrate through the release layer;
    bringing an etchant into contact with the first layer through the penetrating groove and the separating groove to selectively etch the first layer to transfer the epitaxial layer on the first substrate to the second substrate;
    bonding at least a portion of the epitaxial layer transferred to the second substrate to a third substrate; and
    separating the second substrate from the epitaxial layer at the release layer to transfer the epitaxial layer from the second substrate to the third substrate.

4. The transfer method according to claim 3, wherein the third substrate is a silicon substrate or a metal substrate.

5. The transfer method according to claim 3, wherein the epitaxial layer is transferred from the second substrate to the third substrate in a wafer scale.

6. The transfer method according to claim 3, wherein a bonding layer of a predetermined thickness is arranged on at least one of a portion of the epitaxial layer and a region, to which the portion of the epitaxial layer is to be transferred, on the third substrate, the portion of the epitaxial layer is bonded to the third substrate by the bonding layer, and the second substrate is separated from the portion of the epitaxial layer bonded to the third substrate at the release layer.

7. The transfer method according to claim 6, wherein a predetermined unevenness is formed on a region on the third substrate, other than the region to which the portion of the epitaxial layer is to be transferred.

8. The transfer method according to claim 3, wherein the second substrate is transparent, the release layer includes a material whose decomposition or decrease in bonding strength occurs when subjected to irradiation with light, and the release layer between the epitaxial layer to be transferred and the second substrate is irradiated with light to separate the epitaxial layer to be transferred from the second substrate at the release layer.

9. The transfer method according to claim 3, wherein the release layer includes a material whose decomposition or decrease in bonding strength occurs when subjected to heating or cooling, and the release layer between the epitaxial layer to be transferred and the second substrate is heated or cooled to separate the epitaxial layer to be transferred from the second substrate at the release layer.

10. A substrate structure comprising:
    one of a silicon substrate, a metal substrate and a transparent substrate; and
    a gallium nitride system compound semiconductor layer obtained by the forming method according to claim 1 and bonded to the substrate.

11. A device comprising:
    a portion fabricated by processing the substrate structure according to claim 10; and
    an electrode formed on the compound semiconductor layer or the substrate.

12. An LED array comprising:
    a plurality of LEDs each fabricated by processing the substrate structure according to claim 10; and
    a driver circuit configured to drive the LED.

13. An LED printer head comprising:
    the LED array according to claim 12; and
    a rod lens array arranged facing the LED array.

14. An LED printer comprising:
    an LED printer head including the LED array according to claim 12;
    a photosensitive member;
    an electrostatic charging device; and
    an image forming portion configured to form an electrostatic latent image on the photosensitive member with light from the LED printer head used as a light source.

15. An LED color printer comprising:
    a plurality of LED printer heads each including the LED array according to claim 12;
    a plurality of photosensitive members;
    a plurality of electrostatic charging devices; and
    a plurality of image forming portions each configured to form an electrostatic latent image on the photosensitive member with light from the LED printer head used as a light source.

16. An integrated circuit comprising:
    a transistor fabricated by processing the substrate structure according to claim 10; and
    a driver circuit configured to drive the transistor.

17. A method comprising:
    forming a first layer containing silicon oxide on a first substrate of a sapphire or a SiC substrate;
    partially removing the first layer to form an exposure portion on the first substrate;
    depositing amorphous gallium nitride system compound semiconductor on the first substrate with the exposure portion;
    evaporating the semiconductor on the first layer to form cores of the semiconductor on the exposure portion of the first substrate;

forming an epitaxial layer of the semiconductor on the first substrate; and removing the epitaxial layer of the gallium nitride system compound semiconductor on the exposure portion on the first substrate to form a separating groove, wherein a portion of the epitaxial layer is selectively transferred using a bonding layer of a predetermined thickness placed on the portion, and the predetermined thickness is approximately in a range from 1.0 micron to 10 microns.

18. The method according to claim 17, wherein the forming the epitaxial layer is through increase in a size of at least one of the core, combination of the cores, crystal growth, formation of facets, bending of dislocation lines, transverse crystal growth onto the first layer, collision between adjoining crystal grains, combination of the transversely grown crystals, formation of dislocation networks, and formation of a flat surface of the semiconductor.

19. A transfer method by the forming method according to claim 17 to another substrate different from the first substrate, the method comprising:

exposing an end portion of the first layer on the first substrate;

preparing a second substrate with a release layer capable of falling in a releasable condition when subjected to a predetermined process formed thereon and a penetrating groove formed therein;

bonding the first substrate to the second substrate through the release layer; and bringing an etchant into contact with the first layer through the penetrating groove and the separating groove to selectively etch the first layer to transfer the epitaxial layer on the first substrate to the second substrate;

bonding at least a portion of the epitaxial layer transferred to the second substrate to a third substrate.

20. The transfer method according to claim 19 further comprising:

separating the second substrate from the epitaxial layer at the release layer to transfer the epitaxial layer from the second substrate to the third substrate.

* * * * *

UNITED STATES PATENT AND TRADEMARK OFFICE
CERTIFICATE OF CORRECTION

PATENT NO. : 8,053,335 B2  
APPLICATION NO. : 12/611791  
DATED : November 8, 2011  
INVENTOR(S) : Takao Yonehara Page 1 of 1

It is certified that error appears in the above-identified patent and that said Letters Patent is hereby corrected as shown below:

On the Title Page  
Item (73) should read,  
Assignee: CANON KABUSHIKI KAISHA, Tokyo (JP)

Signed and Sealed this  
Twenty-second Day of May, 2012

David J. Kappos  
*Director of the United States Patent and Trademark Office*